United States Patent
Kubota et al.

(10) Patent No.: US 8,304,098 B2
(45) Date of Patent: Nov. 6, 2012

(54) HARD-COATED MEMBER, AND ITS PRODUCTION METHOD

(75) Inventors: Kazuyuki Kubota, Narita (JP); Hitoshi Ohnuma, Narita (JP)

(73) Assignee: Hitachi Tool Engineering, Ltd., Tokyo (JP)

( * ) Notice: Subject to any disclaimer, the term of this patent is extended or adjusted under 35 U.S.C. 154(b) by 347 days.

(21) Appl. No.: 12/682,535

(22) PCT Filed: Oct. 12, 2007

(86) PCT No.: PCT/JP2007/069993
§ 371 (c)(1),
(2), (4) Date: Apr. 9, 2010

(87) PCT Pub. No.: WO2009/047867
PCT Pub. Date: Apr. 16, 2009

(65) Prior Publication Data
US 2010/0215912 A1    Aug. 26, 2010

(51) Int. Cl.
*B23B 27/14* (2006.01)
(52) U.S. Cl. .............. 428/697; 204/192.15; 204/192.16; 428/336; 428/698; 428/699
(58) Field of Classification Search .................. 204/192, 204/192.15, 192.16; 428/336, 697, 698, 428/699
See application file for complete search history.

(56) References Cited

U.S. PATENT DOCUMENTS

| | | | |
|---|---|---|---|
| 5,707,748 A | 1/1998 | Bergmann | |
| 6,071,560 A * | 6/2000 | Braendle et al. | 204/192.38 |
| 6,213,692 B1 | 4/2001 | Guehring et al. | |
| 6,617,057 B2 * | 9/2003 | Gorokhovsky et al. | 428/698 |
| 7,150,925 B2 * | 12/2006 | Sato et al. | 428/698 |
| 7,226,670 B2 * | 6/2007 | Derflinger et al. | 428/697 |
| 7,354,640 B2 * | 4/2008 | Kubota | 428/336 |
| 7,537,822 B2 * | 5/2009 | Ishikawa | 428/699 |
| 7,838,132 B2 * | 11/2010 | Ahlgren et al. | 428/697 |

(Continued)

FOREIGN PATENT DOCUMENTS

CN     1710144 A    12/2005

(Continued)

OTHER PUBLICATIONS

European Search Report issued in Application No. 07829729.8 dated May 16, 2011.

(Continued)

*Primary Examiner* — Archene Turner
(74) *Attorney, Agent, or Firm* — Sughrue Mion, PLLC

(57) ABSTRACT

The hard-coated member of the present invention having a compression-stress-loaded hard coating having a thickness of 5 μm or more, the hard coating having a face-centered cubic structure having a composition represented by $(Me_{1-a}X_a)_\alpha (N_{1-x-y}C_xO_y)$, wherein Me is at least one element selected from Groups 4a, 5a and 6a, X is at least one element selected from the group consisting of Al, Si, B and S, a, x and y are respectively the contents (atomic ratios) of X, C and O, and α is a ratio of $(Me_{1-a}X_a)$ to $(N_{1-x-y}C_xO_y)$, meeting $0.1 \leq a \leq 0.65$, $0 \leq x \leq 0.1$, $0 \leq y \leq 0.1$, and $0.85 \leq \alpha \leq 1.25$; and the X-ray diffraction of the hard coating having a peak intensity $I_r$ of a (111) plane, a peak intensity $I_s$ of a (200) plane, and a peak intensity $I_t$ of a (220) plane, meeting $2 \leq I_s/I_r$, and $0.2 \leq I_t/I_r \leq 1$, and the (200) plane having a half-value $W(°) \leq 0.7$.

16 Claims, 7 Drawing Sheets

U.S. PATENT DOCUMENTS

| | | | |
|---|---|---|---|
| 7,960,016 B2 * | 6/2011 | Lechthaler et al. | ........ 204/192.1 |
| 2004/0237840 A1 | 12/2004 | Yamamoto et al. | |
| 2005/0019612 A1 | 1/2005 | Sato et al. | |
| 2005/0284747 A1 | 12/2005 | Kubota | |

FOREIGN PATENT DOCUMENTS

| | | |
|---|---|---|
| CN | 1899736 A | 1/2007 |
| EP | 0709483 A2 | 5/1996 |
| EP | 1726686 A1 | 11/2006 |
| JP | 07-157862 A | 6/1995 |
| JP | 07-164211 A | 6/1995 |
| JP | 07-188901 A | 7/1995 |
| JP | 08-127862 A | 5/1996 |
| JP | 08-209334 A | 8/1996 |
| JP | 09-300106 * | 11/1997 |
| JP | 09-300106 A | 11/1997 |
| JP | 11-502775 A | 3/1999 |
| JP | 2000-034561 A | 2/2000 |
| JP | 2001-277006 A | 10/2001 |
| JP | 2002-103122 A | 4/2002 |
| JP | 2003-071611 A | 3/2003 |
| JP | 2003-136302 A | 5/2003 |
| JP | 2003-136303 A | 5/2003 |
| JP | 2003-145313 A | 5/2003 |
| JP | 2003145315 | 5/2003 |
| JP | 2003-193219 A | 7/2003 |
| JP | 2005-186227 A | 7/2005 |
| JP | 2005-271155 A | 10/2005 |
| JP | 2005-335040 A | 12/2005 |
| JP | 2006-009059 A | 1/2006 |
| JP | 2006002227 | 1/2006 |
| JP | 2006-137982 A | 6/2006 |
| JP | 2006-316351 A | 11/2006 |
| JP | 2006-342414 A | 12/2006 |
| JP | 2007-056323 A | 3/2007 |
| WO | 2006041367 A1 | 4/2006 |

OTHER PUBLICATIONS

Chinese Office Action issued in Application No. 200780101061.5 dated Oct. 10, 2011.

* cited by examiner 0.5 μm 20 nm

HARD-COATED MEMBER, AND ITS PRODUCTION METHOD

CROSS REFERENCE TO RELATED APPLICATION

This application is a National Stage of International Application No. PCT/JP2007/069993, filed Oct. 12, 2007, the contents of which is incorporated herein by reference in its entirety.

FIELD OF THE INVENTION

The present invention relates to a member used for machining metal parts, etc., particularly to a hard-coated member having a hard coating on a surface required to have high wear resistance and chipping resistance, and its production method.

BACKGROUND OF THE INVENTION

Recent metal-machining tools, sliding members, etc. are produced by forming hard coatings having high hardness and heat resistance on members of high-speed steel or cemented carbide. Coating technologies include chemical vapor deposition (CVD) for forming hard coatings with residual tensile stress, and physical vapor deposition (PVD) for forming hard coatings with residual compression stress. CVD-coated members are mainly used for turning, while PVD-coated members are mainly used for milling.

Both coating technologies have advantages and disadvantages. For instance, CVD can form coatings as thick as 10 μm or more, which have excellent adhesion to have improved wear resistance, but are poor in chipping resistance because of residual tensile stress. Further, because CVD temperatures are as high as about 1000° C., member materials suitable for CVD are restricted.

PVD coatings have excellent chipping resistance because of residual compression stress. Because of lower coating temperatures than in CVD, member materials suitable for PVD are not restricted. However, because of residual compression stress increasing as the thickness of coatings, PVD coatings of 3 μm or more in thickness are generally poor in adhesion than the CVD coatings. Accordingly, hard PVD coatings should be thinner than hard CVD coatings to secure adhesion. CVD is thus used rather than PVD, for instance, for turning tools requiring wear resistance.

JP 2003-136302 A discloses a hard PVD coating of TiAlN having an average thickness of 2-15 μm, which has high orientation in a (200) plane, and an X-ray diffraction peak whose half-value (2θ) is 0.6° or less. JP 2003-145313 A discloses a hard PVD coating of TiAlSiN having an average thickness of 2-10 μm, which has high orientation in a (200) plane, and an X-ray diffraction peak whose half-value (2θ) is 0.5° or less. JP 2003-136302 A and JP 2003-145313 A describe that cemented carbide tools having highly-oriented, hard PVD coatings of TiAlN or TiAlSiN exhibit excellent wear resistance in high-speed cutting of steel, soft steel, etc. causing high heat generation. However, thick coatings have large strain and thus large residual compression stress, resulting in deteriorated adhesion and chipping resistance.

JP 2003-71611 A discloses a hard coating for a cutting tool, which has a composition of $(Ti_{1-a-b-c-d}Al_aCr_bSi_cB_d)(C_{1-e}N_e)$, wherein a, b, c, d and e are the atomic ratios of Al, Cr, Si, B and N, meeting $0.5 \leq a \leq 0.8$, $0.06 \leq b$, $0 \leq c \leq 0.1$, $0 \leq d \leq 0.1$, $0.01 \leq c+d \leq 0.1$, $a+b+c+d<1$, and $0.5 \leq e \leq 1$, the X-ray diffraction intensities I(111), I(200) and I(220) of a (111) plane, a (200) plane and a (220) plane in the hard coating meeting $I(220) \leq I(111)$, $I(220) \leq I(200)$, and $I(200)/I(111) \geq 0.3$. However, the hard coating in Example of JP 2003-71611 A is as thin as 3 μm, poor in wear resistance. Although a high-hardness coating is formed by as high bias voltage as 100 V or more, the residual compression stress of the coating increases as it becomes as thick as, for instance, 5 μM or more, resulting in decrease in adhesion and chipping resistance.

JP 9-300106 A discloses a cemented carbide insert having a hard coating made of a composite nitride, carbonitride or carbide of Ti and Al, in which a ratio Ib(220)/Ia(111) of the intensity Ib(220) of a (220) plane to the intensity Ia(111) of a(111) plane in an X-ray diffraction is in a range of 1.0<Ib/Ia≦5.0. However, the hard coating described in JP 9-300106 A has poor crystal grain boundary strength (adhesion) at a thickness of, for instance, about 5 μm, though stress can be lowered by controlling the peak intensity of a (220) plane if the coating is as thin as about 3 μm. Defects existing in the crystal grain boundaries increase as the hard coating becomes thicker, thereby extremely deteriorating chipping resistance.

JP 2001-277006 A discloses the inclusion of pluralities of TiN layers in, for instance, a TiAlN layer to reduce residual stress. However, this introduces many lattice defects into the hard coating, particularly defects between the TiN layers and the TiAlN layers. Accordingly, this hard coating has poor resistance to shearing impact and thus poor chipping resistance because the lattice defects act as starting points of breakage when made thicker, despite improved abrasive wear resistance.

JP 8-209334 A and JP 7-188901 A disclose the reduction of residual compression stress in PVD coatings having a thickness of 3-4 μm. The formed hard coatings have high adhesion because of reduced residual compression stress, but are poorer in wear resistance than the CVD coatings because of smaller thickness.

JP 2007-56323 A discloses a hard coating having excellent adhesion and lubrication with a controlled ratio of metal elements to gas elements both forming the hard coating. However, it is difficult to form a uniform hard coating because it has a multi-layer structure in which component ratios change in each layer.

JP 7-157862 A discloses a hard PVD coating having recesses as deep as 0.2-2 μm provided by removing droplets projecting from the surface by cutting or grinding, describing that the smoothening of the hard coating surface improves chipping resistance and wear resistance. It is also described that the recesses on the surface can receive a lubricant. In recent high-performance machining, however, such recesses provide the surrounding coating portions with reduced mechanical strength. The droplets remain in the hard coating as defects even if their portions projecting from the surface are removed. Accordingly, when they are exposed on the surface after machining, the hard coating has poor impact resistance and heat resistance.

JP 2005-335040 A discloses a hard PVD coating having a predetermined surface roughness, which has the minimum thickness t near a cutting edge portion and the maximum thickness T on a face or flank meeting $0 \leq t/T \leq 0.8$. It describes that surface smoothing provides the hard coating with improved chipping resistance and wear resistance. It further describes that the hard coating surface can be smoothed by various grinding methods such as brushing, blasting, barrel finishing, etc. As described in JP 2005-335040 A, however, the smoothing of the hard coating surface exposes droplets existing in the coating from the surface. Because the exposed droplets are softer than the surrounding hard coating phase, uneven wear occurs locally, resulting in recesses on the surface, which deteriorate seizure resistance. Also, the recessed surface has poor heat resistance, vulnerable to oxidation wear.

JP 2000-34561 A and JP 2003-193219 A disclose methods for reducing droplets in a hard coating. However, they are improvement in an apparatus, failing to eliminate droplets completely. In addition, no consideration is made at all on droplets contained in the hard coating. The droplets contained in the hard coating act as defects, directly deteriorating the properties of the hard coating.

As described above, conventional technologies fail to provide a thick hard PVD coating with high hardness and heat resistance as well as improved chipping resistance and wear resistance, without deteriorating adhesion to a substrate and mechanical strength to impact from outside.

Object of the Invention

Accordingly, an object of the present invention is to provide a hard-coated member having a thick hard coating having a residual compression stress, which is reduced to obtain high adhesion and chipping resistance without losing excellent mechanical properties such as hardness and heat resistance, thereby having excellent adhesion, wear resistance and chipping resistance.

Disclosure of the Invention

As a result of intensive research in view of the above object, it has been found that when a PVD-formed, hard coating having a face-centered cubic structure of a metal nitride, carbide or oxycarbonitride has a peak intensity $I_r$ of a (111) plane, a peak intensity $I_s$ of a (200) plane, and a peak intensity $I_t$ of a (220) plane in its X-ray diffraction, which are in controlled ranges, the hard coating has excellent wear resistance and chipping resistance without deteriorating adhesion to a substrate even if it is made thick. The present invention has been completed based on such finding.

Thus, the first hard-coated member of the present invention has a hard coating having a compression stress and a thickness of 5 μm or more, the hard coating having a face-centered cubic structure having a composition represented by $(Me_{1-a}X_a)_\alpha(N_{1-x-y}C_xO_y)$, wherein Me is at least one element selected from Groups 4a, 5a and 6a, X is at least one element selected from the group consisting of Al, Si, B and S, a, x and y are respectively the contents (atomic ratios) of X, C and O, and $\alpha$ is a ratio of $(Me_{1-a}X_a)$ to $(N_{1-x-y}C_xO_y)$, meeting $0.1 \leq a \leq 0.65$, $0 \leq x \leq 0.1$, $0 \leq y \leq 0.1$, and $0.85 \leq \alpha \leq 1.25$; and the X-ray diffraction of the hard coating having a peak intensity $I_r$ of a (111) plane, a peak intensity $I_s$ of a (200) plane, and a peak intensity $I_t$ of a (220) plane, meeting $2 \leq I_s/I_r$, and $0.2 \leq I_t/I_r \leq 1$, and the (200) plane having a half-value $W(°) \leq 0.7$. The hard-coated member of the present invention has high coating adhesion, wear resistance and chipping resistance even if the hard coating is made thick.

Because the hard coating is composed of a nitride, carbonitride or oxycarbonitride having a face-centered cubic structure comprising at least one element Me selected from Groups 4a, 5a and 6a, and at least one element X selected from the group consisting of Al, Si, B and S, the hard coating has high hardness and heat resistance and excellent wear resistance. Having a thickness of 5 μm or more, the hard coating is provided with higher wear resistance. Because too thick a hard coating has excessively high compression stress, its thickness is preferably 30 μm or less.

With the contents x and y (by atomic ratio) of C and O restricted to $0 \leq x \leq 0.1$ and $0 \leq y \leq 0.1$, the hard coating can have high hardness, heat resistance (oxidation resistance), adhesion and lubrication.

With the ratio $\alpha$ of $(Me_{1-a}X_a)$ to $(N_{1-x-y}C_xO_y)$ restricted to $0.85 \leq \alpha \leq 1.25$, the hard coating can have an optimally controlled residual compression stress and high adhesion.

With a peak intensity of a (111) plane, a peak intensity $I_s$ of a (200) plane, and a peak intensity $I_t$ of a (220) plane in the X-ray diffraction of the hard coating restricted to meet $2 \leq I_s/I_r$, and $0.2 \leq I_t/I_r \leq 1$, the hard coating has an optimally controlled residual compression stress and high adhesion when made thick. For instance, when $I_s/I_r$ is less than 2, or when $I_t/I_r$ is less than 0.2, the hard coating has a fine cross section structure, resulting in increased residual stress. When $I_t/I_r$ is more than 1, the residual stress is reduced, but bonding strength (adhesion) in grain boundaries of the hard coating is so reduced that when receiving mechanical impact from outside, the hard coating surface is easily broken, and the hard coating peels from the substrate.

With the half-value $W(°)$ of the (200) plane in the X-ray diffraction of the hard coating restricted to $W \leq 0.7$, a thick hard coating has higher crystallinity and thus higher mechanical strength. Also, the hard coating has an optimally controlled residual compression stress and high adhesion. When W exceeds 0.7, the hard coating has high hardness because of a fine structure, but when made thick, it has high residual compression stress and low adhesion.

The hard-coated member preferably comprises a substrate having a surface roughness Ra of 0.2 μm or more, the peak intensity ratio $I_t/I_r$ meeting $0.6 \leq I_t/I_r \leq 1$. With the substrate having a large surface roughness Ra, the hard coating formed thereon has a fine structure, resulting in many defects in grain boundaries. As a result, the hard coating has an increased residual compression stress and deteriorated adhesion. When the hard coating is formed on a relatively rough surface of a cutting tool, etc., the hard coating has large residual stress at $I_t/I_r$ of less than 0.6, failing to have high adhesion. When $I_t/I_r$ exceeds 1, the adhesion is lowered.

The hard coating preferably contains crystal grains having a structure other than the face-centered cubic structure. With the other crystal structure than the face-centered cubic structure, the hard coating has higher hardness, wear resistance and lubrication.

The second hard-coated member of the present invention has compression stress and a thickness of 5 μm or more, the hard coating being made of a compound having a composition represented by $(Me_{1-a}X_a)_\alpha(N_{1-x-y}C_xO_y)$, wherein Me is at least one element selected from Groups 4a, 5a and 6a, X is at least one element selected from the group consisting of Al, Si, B and S, a, x and y are respectively the contents (atomic ratios) of X, C and O, and $\alpha$ is a ratio of $(Me_{1-a}X_a)$ to $(N_{1-x-y}C_xO_y)$, meeting $0.1 \leq a \leq 0.65$, $0 \leq x \leq 0.1$, $0 \leq y \leq 0.1$, and $0.85 \leq \alpha \leq 1.25$; compound crystal grains grown from $(Me_{1-a}X_a)$-based droplets in the hard coating projecting from the hard coating surface; and a ratio L/T of the length L of the compound crystal grains to the thickness T of the coating meeting $0.1 \leq L/T \leq 1.2$.

When the ratio L/T of the length L of the compound crystal grains contained in the hard coating to the thickness T of the overall hard coating is more than 1.2, hard crystal grains largely projecting from the hard coating surface act as "file," resulting in extremely deteriorated resistance to the seizure (deposition) of a work. When L/T is less than 0.1, the compound crystal grains do not grow from the droplets, so that the droplets remain as defects in the hard coating, resulting in extremely poor mechanical properties such as chipping resistance, etc.

In the hard coating, crystal grains preferably have a columnar crystal structure having a composition variation. With the columnar crystal structure, the hard coating has extremely high mechanical strength, particularly chipping resistance. With crystal grains having a composition variation, the residual stress of the hard coating is relaxed, so that the hard coating can be made as thick as 5 μm or more. The term "composition variation" means that the percentages of elements constituting the hard coating are varying in a thickness direction. In the case of TiAlN, for instance, Al (atomic weight: about 27) and N (atomic weight: about 14), lighter elements than Ti (atomic weight: about 48), are preferably distributed in the hard coating not uniformly but with periodic change in a thickness direction.

The adhesion (critical load) A of the hard coating to the substrate measured by a scratching test is preferably 10 N (newton) or more. When the adhesion is less than 10 N, the hard coating cannot withstand residual stress.

The hard coating surface of the hard-coated member of the present invention is preferably ground mechanically, so that a thickness ratio β(TA/TB) meets 1≦β≦300, wherein TA and TB represent the thickness of its thickest and thinnest portions. When β exceeds 300, a large surface area of the substrate is exposed by grinding, resulting in deteriorated chipping resistance and heat resistance.

The hard-coated member preferably has an outermost layer of a hexagonal crystal structure. Higher lubrication is obtained by the outermost layer of a hexagonal crystal structure than by the outermost layer of a face-centered cubic structure.

There is preferably a metal layer having a thickness of 10-200 nm between the substrate and the hard coating. The metal layer provides stronger adhesion.

The hard coating is preferably formed on a tool. A face angle $\theta_1$ from the tip of a cutting edge to a tool body preferably meets $10°≦\theta_1≦35°$. When $\theta_1$ is less than 10°, the hard coating is likely to receive a force in a shear direction, resulting in high cutting resistance, and thus low heat resistance of the substrate, so that the substrate is plastically deformed. Because the hard coating formed on the member of the present invention has compression stress, it cannot follow the plastic deformation of the substrate by heat, resulting in breakage. When $\theta_1$ is larger than 35°, the member is subjected to low cutting heat and resistance, but it has a sharp cutting edge tip, on which plasma is concentrated in the course of coating. As a result, the hard coating at the cutting edge tip is so thick that it is vulnerable to breakage.

The method of the present invention for producing a hard-coated member comprises conducting coating at a substrate temperature of 550-800° C. and a reaction pressure of 3.5-11 Pa. The coating is preferably conducted at a bias voltage of −20 to −100 V and a pulse frequency of 5-35 kHz. With these conditions, a thick hard coating can be provided with an optimally controlled residual compression stress, and high adhesion.

Effect of the Invention

The hard-coated member of the present invention with optimally controlled residual compression stress has high adhesion with reduced defects in the coating. Accordingly, a thick hard coating of 5 μm or more formed by PVD has high adhesion without losing excellent mechanical properties such as hardness, heat resistance, etc. This hard-coated member with excellent coating adhesion, wear resistance and chipping resistance is suitable as a turning tool, a milling tool, a sliding member, etc.

DESCRIPTION OF THE PREFERRED EMBODIMENTS

[1] Hard Coating

The first hard-coated member of the present invention comprises a compression-stress-loaded hard coating having a thickness 5 μm or more, the hard coating having a face-centered cubic structure having a composition represented by $(Me_{1-a}X_a)_\alpha(N_{1-x-y}C_xO_y)$, wherein Me is at least one element selected from Groups 4a, 5a and 6a, X is at least one element selected from the group consisting of Al, Si, B and S, a, x and y are respectively the contents (atomic ratios) of X, C and O, and α is a ratio of $(Me_{1-a}X_a)$ to $(N_{1-x-y}C_xO_y)$, meeting $0.1≦a≦0.65$, $0≦x≦0.1$, $0≦y≦0.1$, and $0.85≦\alpha≦1.25$; the X-ray diffraction of the hard coating having a peak intensity $I_r$ of a (111) plane, a peak intensity $I_s$ of a (200) plane, and a peak intensity $I_t$ of a (220) plane, meeting $2≦I_s/I_r$, and $0.2≦I_t/I_r≦1$, and the (200) plane having a half-value $W(°)≦0.7$.

(1) Composition

Because a hard coating formed by PVD has a residual compression stress, it has excellent chipping resistance but poor wear resistance. By being a nitride, carbonitride or oxy-carbonitride having a face-centered cubic structure comprising at least one element Me selected from Groups 4a, 5a and 6a, and at least one element X selected from the group consisting of Al, Si, B and S, even as thick a hard coating as 5 μm or more has high hardness and heat resistance, excellent wear resistance, low residual compression stress, and high adhesion. Particularly preferable is a hard coating based on TiAlN or CrAlN and comprising Cr, Zr, W, Nb, Si, B, S, etc. The inclusion of C and/or O in a range of 10 atomic % or less improves the lubrication of the hard coating. When Al is not contained, an Si-containing, hard coating such as TiSiN, etc. is preferable because of high hardness and heat resistance.

A hard coating having such excellent functions and high adhesion even with large thickness can be achieved by controlling the residual compression stress of the overall hard coating in an optimum range, and controlling the existence of defects in the thick coating. The residual compression stress tends to increase as the hard coating becomes thicker, though depending on the composition of the hard coating. Accordingly, the thickness of the hard coating is preferably 30 µm or less.

(2) Crystal Structure

Figure 1:
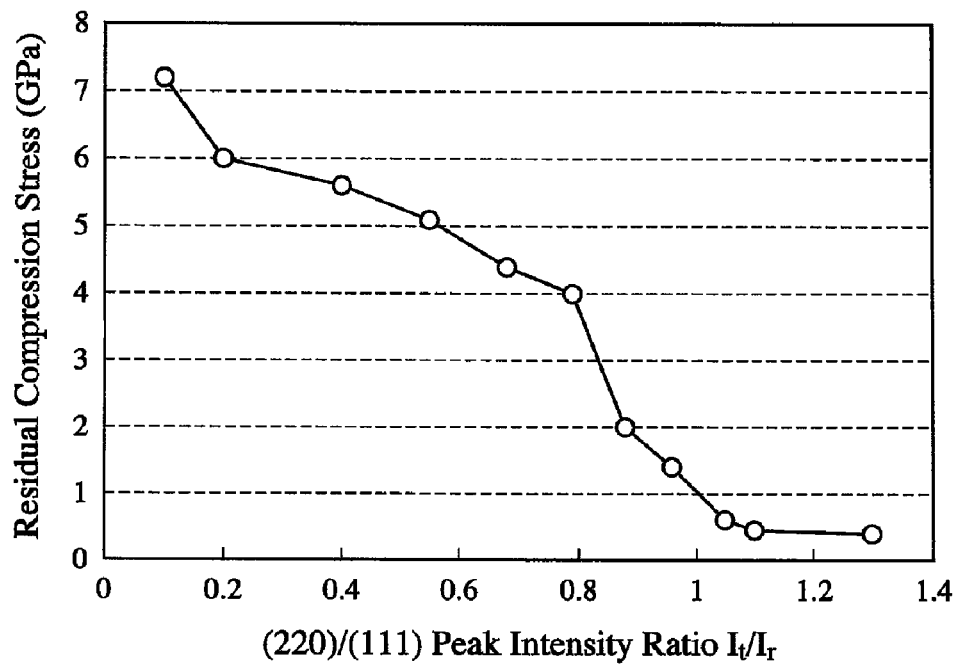
FIG. 1 is a graph showing the relation between a peak intensity ratio of a (220) plane to a (111) plane and a residual compression stress.

The optimum residual compression stress of the thick hard coating has correlation with a ratio $I_t/I_r$ of a peak intensity of a (220) plane to a peak intensity of a (111) plane in the X-ray diffraction of the hard coating, as shown in FIG. 1. To control the residual compression stress in an optimum range of 1-6 GPa, the peak intensity ratio $I_t/I_r$ is controlled to 0.2-1. Further, it is achieved by controlling a ratio $I_s/I_r$ of a peak intensity of a (200) plane to a peak intensity of a (111) plane to 2 or more. Higher orientation to the (111) plane provides the hard coating with higher residual compression stress and lower adhesion. The highest peak is preferably assignable to the (200) plane in the X-ray diffraction of the hard coating.

(a) Control of Crystal Structure

As a result of intense research by the inventors, it has been found that by controlling a bias voltage, a reaction pressure and a temperature during coating, the crystal structure of the hard coating can be controlled to the above range to obtain a thick hard coating having an optimum residual compression stress. The residual compression stress tends to increase as the bias voltage increases during coating. It is important to grow crystals at a relatively low coating speed of 2 µm/hour or less. In this case, the optimized residual compression stress is 0.5-6 GPa, more preferably 1-5 GPa. The residual compression stress of less than 0.5 provides insufficient chipping resistance despite enough wear resistance. When it exceeds 6, the adhesion is deteriorated.

(i) Bias Voltage

Although a negative bias voltage is applied to a substrate in the case of PVD, only the absolute value of the bias voltage is described herein for simplicity. Accordingly, it should be noted that the level of the bias voltage is compared by its absolute value. The control of the bias voltage to −20 to −100 V leads to a peak intensity ratio $I_s/I_r$ of 2 or more. As the bias voltage becomes lower in a range of −100 V or less, the $I_s/I_r$ becomes larger, but a hard coating formed at voltage of less than −20 V has low hardness and poor wear resistance, despite a low residual compression stress and high adhesion. The hard coating having a face-centered cubic structure has much larger durability to a force in a shear direction when oriented more in the (200) plane than in the (111) plane.

By controlling a method for applying bias voltage during coating, the peak intensity ratio $I_t/I_r$ can be controlled. Although DC voltage is usually applied, it is necessary to apply a pulsed bias voltage to control the peak intensity ratio $I_t/I_r$. With a pulsed bias voltage, it is possible to control the dynamic energy of hard-coating-constituting elements ionized in plasma to reach a substrate during forming a hard coating. Taking a TiAlN coating for example, explanation will be made below. In the case of coating TiAlN, a TiAl alloy target and a nitrogen reaction gas are generally used. For instance, when an arc ion-plating method is used to coat TiAlN, Ti, Al and N are turned to positive ions in plasma generated by arc discharge, and reach a substrate by bias voltage. When the bias voltage applied is DC having a high potential exceeding −100 V, the ions moving to the substrate have large dynamic energy, making it likely to cause a so-called reverse sputtering phenomenon by which Al, a relatively light metal element, is scattered when impinging on a substrate. As a result, large strain is generated in a crystal lattice, resulting in a fine structure. Accordingly, the resultant hard coating has extremely large residual compression stress and low adhesion despite high hardness. Crystals obtained by coating under such conditions are highly oriented in a (111) plane.

When a DC bias voltage of −100 V or less is applied, there occurs little reverse sputtering phenomenon of Al described above, resulting in little strain in the crystal lattice of the hard coating. As a result, the hard coating tends to have a columnar structure. Because of a relatively low residual compression stress with slightly low hardness, the hard coating has high adhesion. In this case, the strongest peak position is a (200) plane, though a relatively strong crystal growth of a (111) plane is observed. Because a lower DC bias voltage provides a lower peak intensity of a (111) plane, the hard coating has low compression stress, but low impact resistance (chipping resistance) because of increased defects in grain boundaries. To obtain a hard coating having a low compression stress without deteriorating chipping resistance, the bias voltage of −20 to −100 V is preferable.

(ii) Bias Voltage Pulse

Despite the bias voltage of −20 to −100 V, a relatively large peak appears at a position corresponding to a (111) plane. Particularly in the case of a hard coating having a thickness of 5 µm or more, orientation to a (111) plane cannot be fully suppressed merely by the control of the bias voltage. To control residual stress while suppressing crystal growth in a (111) plane, a pulsed bias voltage is preferably applied. With the pulsed bias voltage, the peak intensities of a (111) plane, a (200) plane and a (220) plane are changed. In the case of forming a thick coating with a DC bias voltage of 40 V, a ratio of a peak intensity $I_t$ of a (220) plane to a peak intensity $I_r$ of a (111) plane meets $0.05 \leq I_t/I_r \leq 0.1$. On the other hand, in the case of a pulsed bias voltage of −40 V, the ratio meets $0.2 \leq I_t/I_r \leq 1.0$, the peak intensity of a (111) plane being relatively low. In this case, the residual stress of the hard coating is in a range of 1-5 GPa.

When a pulsed bias voltage is applied, the dynamic energy of ions reaching a substrate can be controlled low, thereby reducing crystal lattice defects in the hard coating, so that columnar crystals are easily formed. A hard coating containing columnar crystal grains has few defects in grain boundaries, resulting in higher crystallinity. As a result, the hard coating has high mechanical impact strength, namely chipping resistance. Further, because ions reaching a substrate can move to an optimum growth position until solidification, a hard coating with fewer defects is formed.

To control the residual compression stress of the hard coating having a thickness of 5 µm or more, it is particularly important to control a pulse frequency of a pulsed bias voltage. Research by the inventors has revealed that a pulse frequency of 5-35 kHz provides a peak intensity ratio of a (220) plane to a (111) plane meeting $0.2 \leq I_t/I_r \leq 1$, thereby controlling the residual compression stress of the hard coating in an optimum range of 1-5 GPa. When the pulse frequency is lower than 5 kHz, the $I_t/I_r$ exceeds 1, failing to obtain high adhesion between columnar crystal grains and thus high chipping resistance, though a hard coating having a columnar structure with low compression stress is formed. When the pulse frequency exceeds 35 kHz, the dynamic energy of ions reaching a substrate is not sufficiently lowered, resulting in $I_s/I_r$ of less than 0.2. As a result, crystal growth in a (111) plane is not suppressed even with the peak intensity ratio $I_s/I_r$ of 2 or more, so that the residual compression stress exceeds 5 GPa, resulting in extremely low adhesion.

(iii) Combination of DC Bias and Pulsed Bias

The hard coating is stably formed by first applying a DC bias voltage to form a primary layer and then continuously applying a pulsed bias voltage. When a pulsed bias voltage is applied at an early stage of coating, the dynamic energy of ions reaching a substrate is extremely low, so that defects likely occur in an interface of a hard coating with the substrate. Accordingly, it is preferable to apply a DC bias voltage to initially form a dense hard coating, and then apply a pulsed bias voltage. A hard coating portion initially formed by applying a DC bias voltage is preferably controlled within 70% of the total thickness. When it exceeds 70%, a residual compression stress increases as the coating becomes thicker, resulting in deteriorated adhesion. A portion formed by applying a DC bias and a portion formed by applying a pulsed bias can be discerned by the observation of a hard coating cross section by an optical microscope or a transmission electron microscope (TEM). The frequency of a pulse applied is preferably controlled such that a ratio of a negative width to a positive width in one pulse period is 1, though the ratio may be properly changed and optimized depending on an apparatus used.

As described above, even when coating is conducted by a combination of a DC bias and a pulse bias, a peak intensity ratio of a (200) plane to a (111) plane is controlled to 2 or more, a peak intensity ratio of a (220) plane to a (111) plane is controlled to 0.2-1, and a half-value of a (200) plane is controlled to 0.7° or less, in the X-ray diffraction of the resultant hard coating. A hard coating layer obtained by a DC bias voltage and a hard coating layer obtained by a pulsed bias voltage have an interface having excellent adhesion because of continuous lattice fringes.

(b) Control of Crystallinity

To have high mechanical strength, the hard coating should have high crystallinity. The inventors have found that a hard-coated member having excellent chipping resistance can be obtained by controlling the half-value W of a (200) plane exhibiting the highest peak intensity in an X-ray diffraction to 0.7° or less. The smaller the half-value W, the higher the crystallinity.

To have the half-value W of 0.7° or less, the coating temperature is preferably controlled to 550° C. or higher. A higher coating temperature reduces defects, resulting in high crystallinity in the hard coating. Thus, increase in a residual compression stress, which occurs by making the hard coating thicker, can be suppressed by control of not only a bias voltage but also a coating temperature. When the coating temperature is lower than 550° C., the hard coating has a fine structure, resulting in an increased residual compression stress and extremely deteriorated adhesion.

(c) Gas Composition

Figure 2:
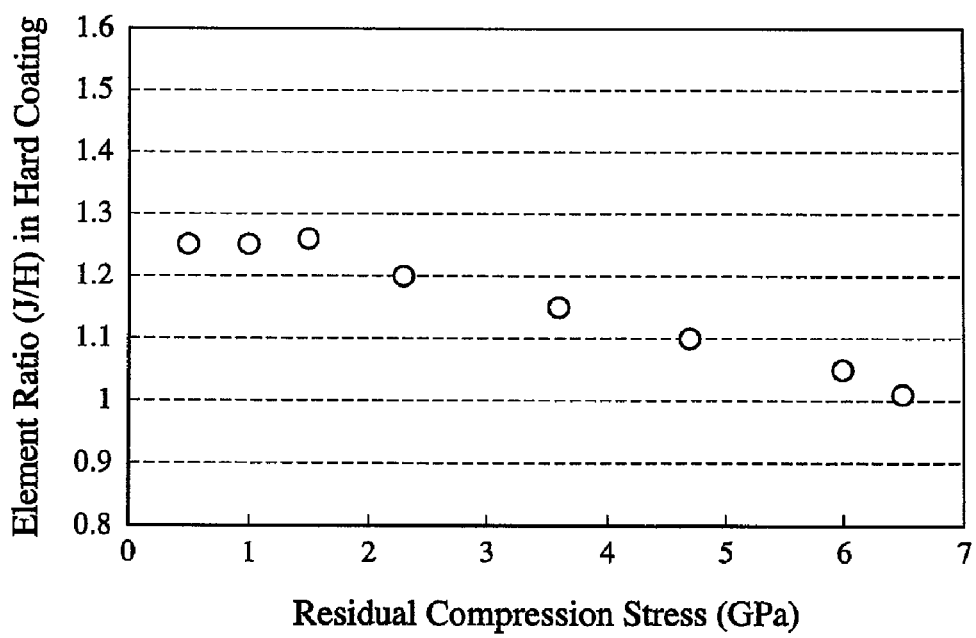
FIG. 2 is a graph showing the relation between residual compression stress and an element ratio in a hard coating.

The residual compression stress can be controlled not only by a bias voltage during coating, but also by a thickness, a reaction pressure, a coating temperature, etc. Although it is affected by the composition of the hard coating, for instance, a larger thickness tends to increase the residual compression stress. Research by the inventors has revealed that in a thick hard coating, there is a correlation between residual compression stress and a ratio of a metal element to a gas element forming the hard coating. In CrAlN coatings having different thickness formed by changing only a coating time, composition analysis was conducted in their vertical or slanting cross sections to calculate a ratio J/H of the total amount J (atomic %) of metal elements to the total amount H (atomic %) of gas elements. Using an electron probe microanalyzer (EPMA, for instance, JXA8500F available from JEOL Ltd.), the measurement of a hard coating was conducted from a position not influenced by a substrate, at an acceleration voltage of 10 kV, a probe current of 1.0 μA and a probe diameter of about 10 μm. The residual compression stress of the hard coating was measured by a curvature measurement method described below, to investigate its correlation with J/H. The results are shown in FIG. 2. It has been found that a larger residual compression stress tends to decrease J/H. Investigation of a similar correlation on several types of hard coatings other than CrAlN by the inventors has revealed the same tendency despite difference in their absolute values. It is thus clear that an optimum residual compression stress range is obtained by controlling the ratio of metal elements to gas elements forming the hard coating.

Figure 3:
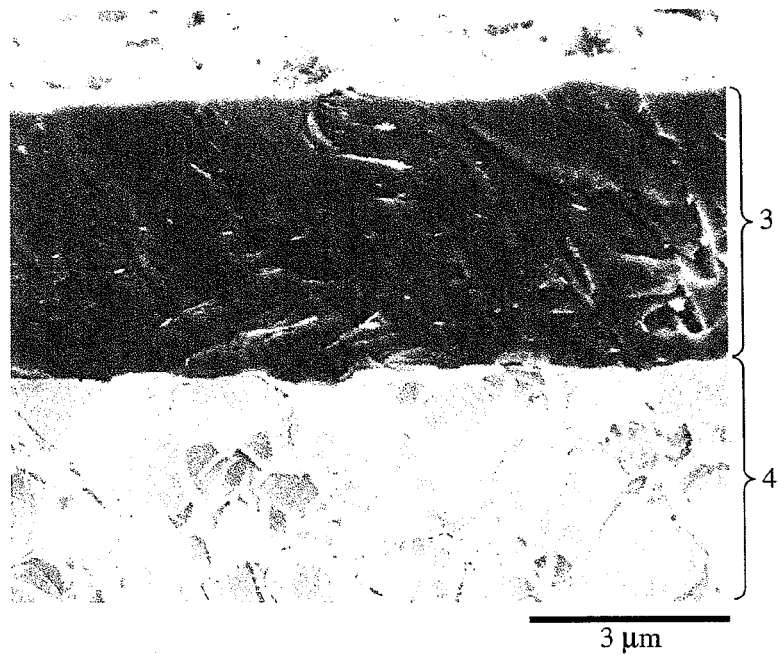
FIG. 3 is a photomicrograph showing a cross section structure of the hard coating.

A ratio α of $(Me_{1-a}X_a)$ to gas elements $(N_{1-x-y}C_xO_y)$ meets $0.85 \leq \alpha \leq 1.25$. When α is less than 0.85, the $(Me_{1-a}X_a)$ elements tend to combine in a crystal lattice, resulting in an extremely large crystal lattice strain, thus losing the continuity of crystal lattice fringes. As shown in FIG. 3, a hard coating 3 formed on a cemented carbide substrate 4 has a fine cross section structure with increased defects in grain boundaries, resulting in an increased residual compression stress and extremely deteriorated adhesion. For instance, in a hard coating for a cutting tool, the defects reduce the density of the hard coating and cause the diffusion of substrate-forming elements into the hard coating, thereby lowering the mechanical properties such as hardness and chipping resistance of the hard coating. To extremely reduce defects in the crystal lattice of the hard coating, α should be controlled to 0.85 or more. When α exceeds 1.25, impurities remaining in an apparatus for forming a hard coating tend to intrude into grain boundaries between crystal grains, though the hard coating has a columnar crystal structure. As a result, bonding strength between crystal grains is so reduced that the hard coating is easily broken by impact from outside. The residual compression stress of the hard coating with optimally controlled α is 0.5-6 GPa by a measurement method described below. The value of α can be managed industrially, and the control of a in a range of $0.85 \leq \alpha \leq 1.25$ turns the residual compression stress of the hard coating to 0.5-6 GPa.

(i) Nitrogen Reaction Pressure

To control a in a range of $0.85 \leq \alpha \leq 1.25$, it is important to control the reaction pressure during coating. In the case of forming nitride, a nitrogen reaction pressure is preferably controlled between 3 Pa and 11 Pa. At a high nitrogen reaction pressure in the above range, ions reaching a substrate have low impinging energy, resulting in a low accumulating (coating) speed of the hard coating. With a low coating speed, lattice defects in crystals decrease, resulting in a columnar structure with extremely few defects. When there are a lot of lattice defects, crystal growth is discontinuous, resulting in many grain boundaries. Strain exists mostly in the grain boundaries, resulting in an increased residual compression stress. Strain is concentration in many grain boundaries, providing low bonding strength between crystal grains. As a result, the cross section structure of the hard coating is made so finer that breakage tends to occur from grain boundaries when receiving strong impact from outside.

Crystals grow with strong orientation in a (111) plane or a (200) plane in a hard coating having a face-centered cubic structure, though variable depending on its composition. Accordingly, the division of crystals grains can be decreased by reducing strain during crystal growth. Namely, high adhesion and damage resistance is achieved by including giant columnar crystals having excellent mechanical strength in the hard coating. Namely, to form a coating thicker than 5 μm, it is important to suppress the formation of crystal grain boundaries during crystal growth. By suppressing the strain-induced discontinuous crystal growth, namely by reducing crystal grain boundaries, the residual compression stress is reduced, thereby providing the hard coating with high density. Thus, the mechanical strength of the hard coating can be extremely increased, thereby providing the hard coating with, for instance, high damage resistance, hardness and toughness.

When the nitrogen reaction pressure is less than 3 Pa, the dynamic energy of ions impinging on a substrate cannot be suppressed, causing strain, and thus failing to suppress a residual compression stress. In this case, α is less than 0.85, a coating near a cutting edge of a cutting tool is spontaneously broken. When coating is conduced at higher than 11 Pa, a plasma density is extremely low. In this case, α exceeds 1.25, resulting in a reduced dynamic energy of ions. As a result, impurities easily intrude into grain boundaries between crystal grains, thereby deteriorating the mechanical properties of the hard coating, though the hard coating has a columnar crystal structure.

(ii) Contents of C and O

With C (carbon) and/or O (oxygen) contained in the hard coating, the lubrication of the hard coating is improved. To add C and/or O to the hard coating, a gas containing a hydrocarbon gas and/or oxygen, or a solid evaporation source containing C and/or O may be used. The optimum amounts of C (carbon) and O (oxygen) contained in the hard coating are 0-10 atomic %. Controlled to such composition, the hard-coated member is provided with an excellent, thick hard coating. When x and/or y exceed 10 atomic %, the crystal structure of the hard coating is made finer, resulting in increase in defects in crystal grain boundaries. Accordingly, despite largely improved lubrication, the mechanical properties such as damage resistance, etc. of the hard coating are extremely deteriorated. When coating is conducted with a gas containing C and/or O, the total pressure of a mixed gas including N, a main gas, should be controlled to 3-11 Pa. When a target containing C and/or O is used to add these elements to the hard coating, conditions should be optimized lest that too much C and/or O are added to the hard coating because of excessive evaporation energy. Because the optimum coating conditions depend on a target and a coating apparatus, they should be determined by experiment, considering the adhesion, etc. of the coating.

(iii) Measurement Method of Gas Composition

The value of α can be determined by measuring the composition of the hard coating in a vertical or slanting cross section from a position not influenced by a substrate by an electron probe microanalyzer (EPMA, for instance, JXA8500F available from JEOL Ltd.), at an acceleration voltage of 10 kV, a probe current of 1.0 μA and a probe diameter of about 10 μm. When measured on a hard coating surface, the probe diameter may be about 50 μm.

(d) Surface Roughness

When a hard coating is formed on a substrate having surface roughness Ra of 0.2 μm or more, a ratio $I_t/I_r$ of a peak intensity $I_t$ of a (220) plane to a peak intensity $I_r$ of a (111) plane in the X-ray diffraction of the resultant hard coating is preferably controlled to a range of $0.6 \leq I_t/I_r \leq 1$. For instance, when a hard coating having $I_t/I_r$ less than 0.6 is formed on a cutting tool, etc. having a relatively rough surface such as an as-sintered surface, the hard coating has a large residual stress, failing to have high adhesion. When $I_t/I_r$ exceeds 1, the adhesion is lowered. To control $I_t/I_r$ in this range in X-ray diffraction, the pulse frequency of a pulsed bias voltage applied is controlled to 10-20 kHz. For instance, an as-sintered surface of a cemented carbide tool has surface roughness Ra of 0.2 μm or more, with a lot of Co (cobalt). Even when a hard coating is formed on such surface, a tool having a hard coating with high adhesion can be obtained by controlling the dynamic energy of ions reaching a substrate.

(e) Ion Radius of Metal

To obtain a hard coating having excellent wear resistance and chipping resistance, a nitride, a carbonitride, an oxycarbonitride, etc. containing an element Me in Group 4a, 5a or 6a having an ion radius of 0.041-0.1 nm and an element X such as Al, Si, B, S, etc. having as small ion radius as 0.002-0.04 nm are preferably coated.

(f) Hexagonal Crystal

The hard coating is preferably controlled to have a face-centered cubic crystal structure having excellent mechanical strength, but a lubricating, hard coating having a hexagonal crystal structure may be formed as an outermost or intermediate layer in combination with the hard coating having a face-centered cubic structure. With face-centered cubic or hexagonal crystals included, the hard coating can have excellent lubrication and wear resistance. Further, the inclusion of fine, crystalline or amorphous grains in the hard coating can increase hardness, resulting in excellent wear resistance. The coexistence of face-centered cubic crystal grains and hexagonal crystal grains means the inclusion of a ZnS structure generated when Al exceeds 60 atomic %, for instance, in the case of TiAlN or CrAlN.

(3) Droplets and Compound Crystal Grains

The hard-coated member of the present invention has a compression-stress-loaded hard coating having a thickness of 5 μm or more, the hard coating being made of a compound having a composition represented by $(Me_{1-a}X_a)_\alpha(N_{1-x-y}C_xO_y)$, wherein Me is at least one element selected from Groups 4a, 5a and 6a, X is at least one element selected from the group consisting of Al, Si, B and S, a, x and y are respectively the contents (atomic ratios) of X, C and O, and α is a ratio of $(Me_{1-a}X_a)$ to $(N_{1-x-y}C_xO_y)$, meeting $0.1 \leq a \leq 0.65$, $0 \leq x \leq 0.1$, $0 \leq y \leq 0.1$, and $0.85 \leq \alpha \leq 1.25$; compound crystal grains grown from $(Me_{1-a}X_a)$-based droplets in the hard coating projecting from the hard coating surface; and a ratio L/T of the length L of the compound crystal grains to the thickness T of the coating meeting $0.1 \leq L/T \leq 1.2$. When the compound crystal grains do not project from a hard coating surface, namely when tip ends of the compound crystal grains are as high as the hard coating surface, there are gaps between the tip portions of compound crystal grains and a surrounding hard coating phase, failing to increase mechanical strength. A larger thickness T is preferable from the aspect of wear resistance, but too thick a hard coating has excessively high compression stress. Accordingly, the thickness T of the hard coating is preferably 30 μm or less.

(a) Control of Droplets

Figure 4:
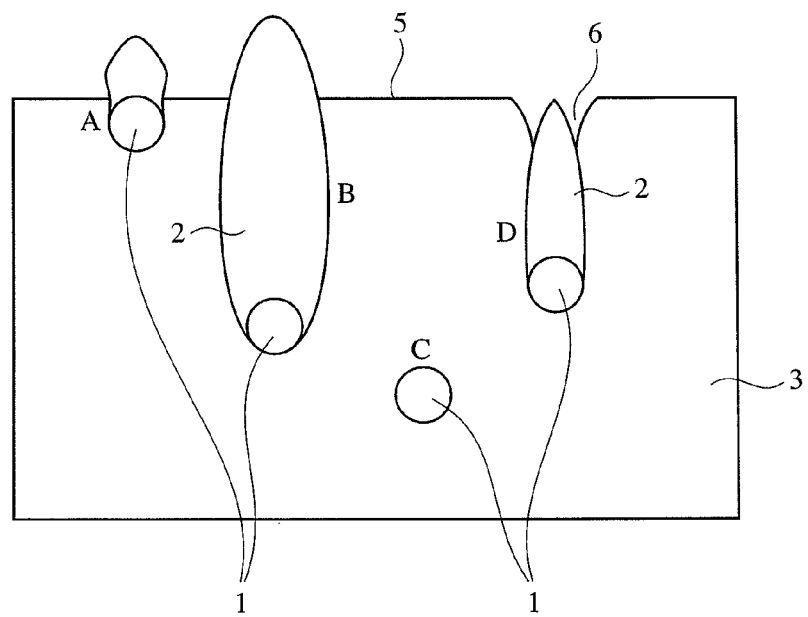
FIG. 4 is a schematic view showing droplets and compound crystal grains existing in the hard coating.

The control of droplets and its completely new utilization, which are important in present invention, will be explained below. In the present invention, compound crystal grains grown from droplets contained in the hard coating project from a hard coating surface, a ratio L/T of the length L of the compound crystal grains to the thickness T of the coating being controlled to meet $0.1 \leq L/T \leq 1.2$. When L/T is larger than 1.2, the hard crystal grains excessively project from the hard coating surface, acting as "file" to extremely deteriorate resistance to the seizure (deposition) of a work. When L/T is less than 0.1, the growth of compound crystal grains from droplets is insufficient, so that the compound crystal grains remain as defects in the hard coating, resulting in extremely deteriorated mechanical properties such as chipping resistance, etc. As shown in FIG. 4, droplets 1 contained in the hard coating 3 may be categorized to four types. In the present invention, it is important to control crystal grains 2 in a state B. When compound crystal grains 2 do not project from a hard coating surface 5, namely when tip ends of the compound crystal grains 2 are at the same height as the hard coating surface as shown in a state D, there are gaps 6 between the tip portions of the compound crystal grains 2 and the surrounding hard coating phase, resulting in low mechanical strength.

To control the compound crystal grains grown to a thickness of 5 μm or more from droplets in the hard coating to meet $0.1 \leq L/T \leq 1.2$, it is important to control the substrate temperature at 550-750° C., and the coating reaction pressure at 3-11 Pa, during coating.

(i) Temperature Control

Figure 5:
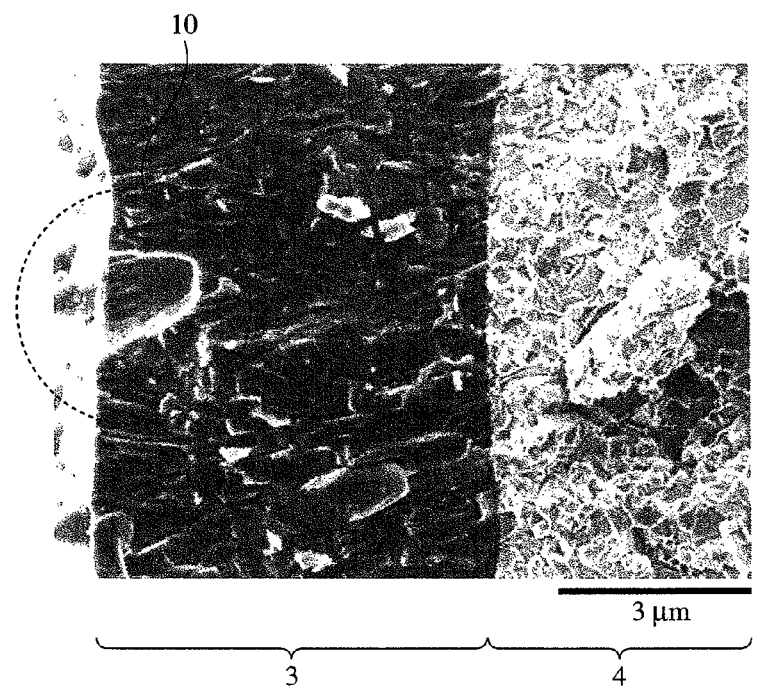
FIG. 5 is a photomicrograph showing the cross section of a hard coating portion from which droplets are detached.
Figure 6:
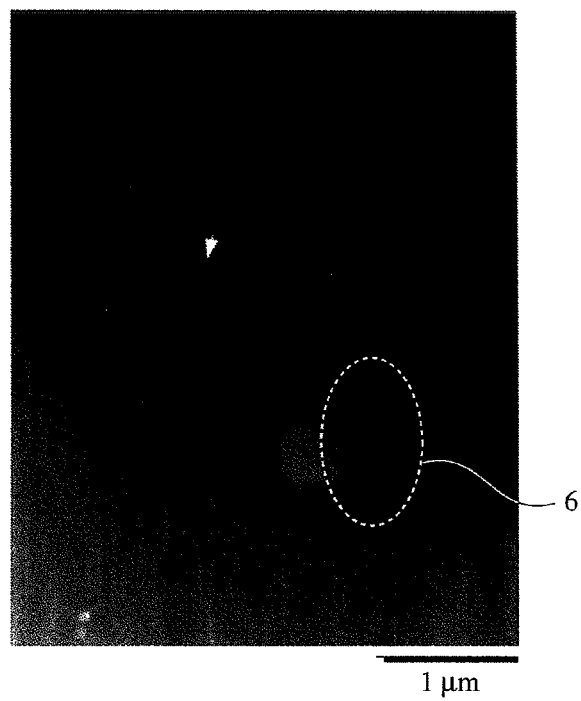
FIG. 6 is a photomicrograph showing a cross section having gaps around droplets in the hard coating.

With a coating temperature higher than a general temperature range of 400-500° C. in a PVD method, it is possible to suppress the generation of strain due to the intrusion of inevitable impurities into the hard coating. The droplets are formed by a molten metal having the composition of the solid evaporation source, which is attached to a substrate substantially without reaction with gas elements during coating. The droplets are typically in a spherical shape or in a liquid droplet shape. Droplets 1 deposited on a surface of the substrate or the hard coating are not compound crystal grains. Accordingly, the droplets 1 attached to a hard coating surface 5 in a state A as shown in FIG. 4 are easily detached. As shown in FIG. 5, the hard coating 3 has recesses 10 from which droplets are detached, acting as starting points of breakage when getting impact from outside. Also, when the droplets are contained in the hard coating 3 without detachment, the crystal growth of compounds such as nitrides, etc. is hindered around the droplets, resulting in gaps 6 around the droplets as shown in FIG. 6. When impurities are taken into the gaps 6 to form defects, the mechanical properties of the hard coating are extremely deteriorated. A thicker hard coating contains more droplets, resulting in increased defects in the coating. Accordingly, to reduce defects to avoid the deterioration of mechanical strength particularly when a thick hard coating is formed, it is important to control coating conditions such that compound crystal grains having the composition of the hard coating easily grow on droplets.

Coating at a temperature of 550° C. or higher increases the dynamic energy of compound-crystal-forming ions reaching droplets and solidifying as nuclei for crystal growth, thereby providing the continuity of lattice fringes between the droplets and the compound. Namely, atoms for forming nuclei of compound crystal grains move on the droplets, so that they are solidified in a hetero-epitaxial state to the droplets to constitute crystal-growth-starting points, from which the compound crystal grains easily grow with strong bonding to the droplets. Further, coating at 550° C. or higher alleviates the strain of crystal grains grown from the nuclei, thereby preventing a residual compression stress from excessively increasing. When coating is conducted at lower than 550° C., L/T is less than 0.1, making it unlikely to cause compound crystal growth from the starting points of droplets. Namely, dynamic energy necessary for forming nuclei is not obtained, making it unlikely that there is a hetero-epitaxial relation between the hard coating crystal and the droplets. As a result, the droplets are discontinuous from compound crystal grains around them, resulting in low mechanical strength.

When the coating temperature exceeds 750° C., the growth of a compound crystal from droplets is accelerated, but the growth occurs radially in the hard coating, so that crystal grains growing in a thickness direction interfere with each other to generate strain. Also, when the compound crystal grains grow radially, L/T tends to exceed 1.2. Further, because compound crystal grains grow on droplet surfaces more slowly than those around them, strain tends to be generated at roots of the compound crystal grains growing from the droplets, resulting in gaps. Accordingly, the hard coating has poor mechanical strength to impact from outside. Because compound crystal grains grown on the droplets are substantially as hard as those around them, they exist as hard projections on a hard coating surface. Because large projections on the coating surface act as a file, a tool having a hard coating with large projections is vulnerable to the mechanical seizure of a work. As a result, even if a highly lubricating hard coating is formed on a cutting tool, etc., its effectiveness is not fully achieved.

(ii) Pressure Control

By controlling the nitrogen reaction pressure at 3-11 Pa during coating, it is possible to suppress boundary defects between crystal grains grown from the droplets and crystal grains around them, thereby preventing the residual compression stress of the hard coating from increasing. Such coating conditions decrease the speed of crystal grains growing on the droplets to form crystal grains at high density. The residual compression stress cannot be suppressed under the reaction pressure of less than 3 Pa, because compound crystal grains grow on the droplets with much strain. When the reaction pressure exceeds 11 Pa, compound crystal grains grow from the droplets, but the mechanical properties such as hardness, etc. of crystal grains around them in the hard coating are deteriorated. The crystal grains grown from the droplets can be observed by a field-emission transmission electron microscope (for instance, JEM-2010F available from JEOL Ltd. acceleration voltage: 20 kV, hereinafter referred to as "TEM"), or a usual scanning electron microscope.

(4) Measurement Method of Residual Stress

To obtain of the hard-coated member of the present invention having a thick hard coating, the level of compression stress remaining in the hard coating should be controlled as described above. In general, the residual compression stress of the hard coating may be evaluated to some extent by determining the sign of a residual compression stress σ in the formula (1) by an X-ray residual stress measurement method using parallel beams.

$$\sigma = -(1/2)[E/(1+\nu)] \cot \theta_0 [d(2\theta)/d \sin(2\Psi)] \quad (1),$$

wherein E is a modulus constant (Young's modulus), ν is a Poisson's ratio, $\theta_0$ is a standard Bragg diffraction angle from a lattice surface with no strain, Ψ is an inclination of a normal to a diffraction lattice surface to a normal to a sample surface, and θ is a Bragg diffraction angle when the angle of the measured sample is Ψ.

To determine whether the sign of the residual stress σ in the formula (1) is positive or negative, only the gradient of a 2θ-sin 2Ψ line is necessary. It is determined that there is a residual tensile stress when the sign σ of the residual stress is positive, while there is a residual compression stress when the sign σ is negative. However, this measurement method cannot calculate a residual stress, when accurate values of a modulus constant (Young's modulus) E, a Poisson's ratio ν, and $\cot \theta_0$ (always positive) are not known. For instance, a residual compression stress largely influencing the adhesion of a hard PVD coating is determined by comparison with a known peak of TiN (JCPDS File No. 38-1420), etc., using the above parallel beam method. However, as described above, when there are various factors such as a complicated composition, a multi-layer structure, etc., in which accurate values of a modulus constant (Young's modulus) E, a Poisson's ratio ν, cot θ₀ (always positive) are not known, it is impossible to calculate the residual stress of the overall hard coating. For instance, even in the case of a widely used hard coating such as TiAlN, it is impossible to determine the residual stress of the overall hard coating when the hard coating has different formulations of Ti, Al and N, or when it has a multi-layer structure.

Namely, only the method of measuring the residual stress of a hard coating by the above-described parallel-beam X-ray diffraction method has been known conventionally, so that only the residual stress of a single-layer, hard coating having a general composition of TiN, TiC, TiCN, ZrN, CrN, MN, etc. can be measured. With respect to a hard coating of TiAlN, etc., only a relative comparison to TiN could be made. Further, in the case of a multi-layer coating of TiN, TiC, TiCN, ZrN, CrN, AlN, TiAlN, etc., the residual stress of each layer can be measured, but the residual stress of the overall hard coating could not be measured.

The residual compression stress of the overall hard coating is defined more accurately herein as follows: The residual compression stress of the overall hard coating determined by this method is called "residual compression stress by a curvature measurement method." The measurement method will be explained below.

When a hard coating is formed on a test piece cut to a predetermined shape from a substrate having known Young's modulus and Poisson's ratio, the test piece is deformed by a residual compression stress generated in the hard coating. Using the measured deformation, the compression stress of the overall hard PVD coating is calculated by the following formula (2):

$$\text{Residual compression stress } \sigma = Es \cdot D^2 \cdot \delta / 3 \cdot L^2 \cdot (1-vs) \cdot d \quad (2),$$

wherein Es is the Young's modulus (GPa) of a substrate used for the test piece, D is the thickness (mm) of the test piece, δ is the deformation (μm) of the test piece after coating, L is a length (mm) from a longitudinal end to the maximum-deformation point of the test piece that is deformed by coating, vs is a Poisson's ratio of the substrate used for the test piece, and d is the thickness (μm) of the hard coating formed on the test piece.

Usable test piece materials include cemented carbide, cermet, high-speed tool steel, etc., whose Young's modulus and Poisson's ratio are already measured, and the cemented carbide is suitable because of little variation of measured values. The test piece preferably has a rectangular shape. For instance, when a test piece of 8 mm in width, 25 mm in length and 0.5-1.5 mm in thickness is used, measured values have little variation, making it easy to confirm stress difference. Further, a test piece of a predetermined shape is preferably mirror-finished on both upper and lower surfaces to have surface roughness within ±0.1 mm, and then heat-treated at 600-1000° C. in vacuum to remove strain from its surface. Without removing strain to some extent, the measured residual compression stress has variation. After the deformation of one mirror-finished surface of the test piece is measured before coating, a coating is formed on the surface, and the deformation of the coated test piece is measured. With the amounts of deformation before and after coating, the length from a longitudinal end to the maximum-deformation point of the test piece deformed by coating, and the thickness of the hard coating measured, the residual compression stress is calculated by the formula (2). Even if the hard coating has different compositions or a multi-layer structure or is formed under different conditions, its residual compression stress can be calculated by this method.

In the above measurement method, a hard coating was formed on a test piece made of JIS Standard K, M or P, ultra-fine cemented carbide, or a TiC- or TiCN-based cermet, to measure a residual compression stress. As a result, it was found that the residual compression stress did not largely vary depending on the types of materials used for the test piece. As described above, a residual compression stress could conventionally be measured only on a hard coating with a single layer having a usual composition, and the residual compression stress of a hard coating of TiAlN, etc. could be obtained only as a relative value to that of TiN, but multi-layer coatings of TiN, TiC, TiCN, ZrN, CrN, AlN, TiAlN, etc. could not be measured with respect to a residual compression stress. However, the use of the curvature measurement method has enabled the direct measurement of a residual compression stress not only on hard coatings with complicated compositions but also on multi-layer coatings, so that how high adhesion each hard coating has to a substrate can be predicted to design a hard coating with improved adhesion. The use of the curvature measurement method has enabled the measurement of a residual compression stress on single-layer coatings, hard coatings with different compositions, hard coatings of the same elements with different percentages, multi-element hard coatings, multi-element, multi-layer hard coatings, hard oxide coatings, hard amorphous carbon coatings, hard diamond coatings, etc.

(5) Other Structures (a) Columnar Crystal Structure

The hard coating of the hard-coated member preferably has a columnar crystal structure. In a TEM observation, crystal grains in the columnar crystal structure preferably have a multi-layer structure with a composition variation. The term "composition variation" used herein means that the ratios of elements forming the hard coating vary in a thickness direction. For instance, when TiAlN is used, the percentages of Al (atomic weight: about 27) and N (atomic weight: about 14), lighter than Ti (atomic weight: about 48), are not uniform in the thickness direction of the hard coating, but substantially periodically changing (increasing and decreasing) in the thickness direction.

(b) Multi-Layer Structure

To provide the crystal grains with a multi-layer structure, a pulsed bias voltage is preferably applied. For instance, when a pulse frequency is controlled to 5-35 kHz at a DC bias voltage of −20 to −200 V, a hard coating with a composition variation can be obtained without depending on the types of elements contained. More preferably, a pulse frequency is 10-35 kHz at a DC bias voltage of −40 to −100 V. These production conditions produce hard coatings as thick as 5 μm or more having excellent chipping resistance, wear resistance and adhesion and low residual compression stress.

Using a pulsed bias voltage, the energy of ions impinging on a substrate changes, forming a soft layer at a low ion-impinging energy and a hard layer at a high ion-impinging energy and thus resulting in a hard coating having a multi-layer structure. For instance, at a DC bias voltage of −100 V, a pulse frequency of 10 kHz, and a positive bias voltage of 0 V, soft layers formed at 0-100 V and hard layers formed at 100 V are alternately laminated to constitute a multi-layer structure. In the case of a TiAlN coating, for instance, softer layers containing more Al having a small ion radius are formed at a low ion-impinging energy, and harder layers containing less Al having a small ion radius are formed at a high ion-impinging energy, thereby producing a multi-layer hard coating having a composition changing depending on a bias voltage applied. Soft layers lower the compression stress of the overall hard coating, making it possible to form a thick coating.

Although a multi-layer hard TiAlN coating having the composition variation of Ti and Al can be formed using targets having different compositions, there is a large composition variation from layer to layer, thereby forming strain-generating gaps. An ideal multi-layer structure has a gradually and substantially continuously changing composition, with a composition variation of within 10 atomic % between layers.

Lattice fringes continuously grow between layers in the multi-layer structure, resulting in excellent mechanical strength. The composition difference Z of an element having a small ion radius, such as Al, Si, B, etc., between layers containing more such element and layers containing less such element is preferably 10 atomic % or less, more preferably 2-10 atomic %. The composition difference occurring when coating is conducted at a bias voltage of less than −20 V is less than 2 atomic %, resulting in insufficient control of a residual compression stress. Further, there is small ion-impinging energy under such conditions, failing to provide a coating, if any, with high adhesion. When Z exceeds 10 atomic %, large strain is generated in the hard coating, resulting in increased residual compression stress. To obtain a stable quality, a DC bias voltage may be applied in an early stage of coating, and a pulsed bias voltage may be applied thereafter.

(c) Adhesion

The adhesion (critical load) A of the hard coating to a substrate is preferably 10 N (newton) or more when measured by a scratching test. When having a compression stress, a thicker hard coating has lower adhesion. A hard coating having a thickness of about 3 μm generally has adhesion exceeding 100 N (newton), but a thicker coating has a larger residual compression stress, resulting in extremely low adhesion. When the hard coating has a thickness exceeding 5 μm, it is extremely difficult to obtain adhesion of 100 N (newton). As the residual compression stress increases, there is higher likelihood that the hard coating peels from a substrate, and that breakage occurs in the hard coating. To prevent peeling and breakage from occurring in a thick hard coating, adhesion of 10 N (newton) or more is needed. The adhesion can be measured by a scratching test up to a load of 100 N at a loading speed V of 2.5 N/sec using a usual scratching test machine comprising a diamond indenter. In the scratching test, a time when breakage or peeling occurs in the hard coating is sensed by an acoustic emission sensor (AE) provided in the test machine, and a load at that time is evaluated as a critical load (unit=N). To achieve the adhesion of 10 N or more in a hard coating as thick as 5 μm or more having a residual compression stress, a pulsed bias voltage applied during coating should be intermittently positive. Namely, the variation of energy of ions impinging on a substrate should be made larger. The adhesion of 10 N or more can be obtained by controlling a DC bias voltage to −20 to −100 V, a pulse frequency to 10-35 kHz, and a positive bias voltage to 5-20 V to provide a large positive-negative gap.

(d) Mechanical Grinding

The hard coating is preferably mechanically ground, such that a ratio $\beta$(TA/TB) of the thickness TA of the thickest coating portion to the thickness TB of the thinnest coating portion meets $1 \leq \beta \leq 300$. As described above, a thicker hard coating contains more droplets, from which crystal grains likely grow to project from the surface. Despite excellent adhesion and chipping resistance, the deposition, etc. of a work on the hard coating surface is likely to occur during contact therewith. To prevent this, it is preferable to remove projections on the hard coating surface by mechanical grinding. The grinding may use a rotating brush, grinding media for blasting, etc. The grinding is preferably conducted to such a depth that $\beta$ is 300 or less, to avoid the substrate from exposing in a large surface area. Machining is also effective to remove only projections from the surface. The thickness ratio $\beta$ can be determined by observing the cross section of the hard coating in a mechanically worked portion.

(e) Metal Layer

A metal layer having a thickness of 10-200 nm is preferably formed between the substrate and the hard coating. Particularly in the case of a substrate having surface roughness Ra exceeding 0.1, the formation of the metal layer makes the substrate surface smooth, resulting in high adhesion. The metal layer also reduces the residual compression stress of the overall hard coating. The metal layer made of a single metal such as Ti, Cr, W, etc. or an alloy such as TiAl, CrAl, TiAlW, etc. is preferably formed by an arc ion-plating method at a DC bias voltage of −600 V or more.

(f) Substrate

The hard-coated member has an optimum balance of wear resistance and toughness, when its substrate is made of WC-based cemented carbide, high-speed tool steel, cermet, etc. When high-speed tool steel is used for the substrate, coating is preferably conducted at 500-550° C. from the aspect of its thermal properties. In the case of coating at such lower temperatures, a bias voltage and a reaction pressure are properly optimized during coating.

(6) Rake Angle

When the hard coating is formed on a turning insert, the insert before coating preferably has a face angle $\theta_1$ of 10° to 35° from a tip end of a cutting edge to a center portion. When $\theta_1$ is smaller than 10°, the hard coating is likely to receive a shearing force, resulting in high cutting resistance. As a result, the substrate is plastically deformed by decrease in strength. When the substrate is plastically deformed by heat, the compression-stress-loaded hard coating cannot follow the plastic deformation, resulting in breakage. When $\theta_1$ is more than 35°, the cutting edge has such a sharp tip end portion that plasma generated during coating is likely concentrated therein, despite reduced cutting heat and resistance. As a result, an excessively thick hard coating is formed in the tip end portion of the cutting edge, so that the hard coating is vulnerable to spontaneous breakage.

[2] Production Method (a) Coating Method

Coating is preferably conducted by such a method that a pulsed bias voltage is applied to impart a residual compression stress to the resultant hard coating. An ion-plating method such as an arc ion-plating method, a sputtering method, a plasma-aided CVD method, etc. are preferable. As long as the production conditions of the present invention are used, it is possible to use one apparatus having the function of each method.

(b) Production Conditions

With bias-voltage-applying conditions controlled during coating, a hard coating with a small residual compression stress can be formed. Particularly by applying a pulsed bias voltage, the residual compression stress of the hard coating can be further reduced. With a DC bias voltage set at −20 to −100 V and a pulse frequency set at 5-35 kHz, a thick hard coating having excellent chipping resistance and wear resistance and an extremely low compression stress to have excellent adhesion can be formed, regardless of elements contained therein. When a pulsed bias voltage is used, there occurs variation in the energy of ions impinging on the substrate. Namely, soft layers are formed at lower ion energy, and hard layers are formed at higher ion energy, resulting in crystal grains having a layer structure having soft layers and hard layers. For instance, when the DC bias voltage is set at −100 V with a pulse frequency of 10 kHz and a positive bias voltage of 0 V, soft layers are formed in a range from 0 V to less than −100 V, and hard layers are formed at 100 V. In the case of forming a (TiAl)N coating with a composition variation, softer layers comprising more Al having a small ion radius are formed under a low ion-impinging energy condition. Harder layers containing less Al having a small ion radius are formed under a high ion-impinging energy condition. This repetition alternately forms soft layers and hard layers. Thus, a coating formed by applying a pulsed bias voltage comprises crystal grains containing soft layers, which suppress the compression stress of the overall hard coating from increasing when it becomes thick. Accordingly, a thick coating can be formed. Lattice fringes grow continuously through layers in composition-varying crystal grains, resulting in a hard coating with excellent mechanical strength. For improved quality stability, a coating may be formed by first applying a DC bias voltage, and then applying a pulsed bias voltage during coating.

The present invention will be explained in more detail referring to Examples below without intention of restricting the scope of the present invention.

Measurement of Residual Compression Stress

Ultra-fine cemented carbide powder comprising WC having a particle size of 0.6 μm mixed with 13% by mass of Co and 0.5% by mass of TaC was compacted to a predetermined test piece shape, sintered at 1530° C. while introducing hydrogen in vacuum. The resultant sintered body was mechanically mirror-finished, and heat-treated at 600-1000° C. in vacuum to remove strain to obtain a test piece. A hard coating was formed only on a mirror-finished surface of this test piece, and the amount of deformation of the test piece after coating was measured to determine a residual compression stress.

Used as coating materials were TiN, CrN, and nitrides, carbonitrides, oxynitrides and oxycarbonitrides of at least one element Me selected from Groups 4a, 5a and 6a and at least one element selected from the group consisting of Al, B, Si and S. With various alloy targets used evaporation sources, hydrocarbon gases such as nitrogen, oxygen, acetylene, etc. were introduced alone or in combination during coating to form nitrides, carbonitrides, oxynitrides and oxycarbonitrides.

Sample 1 (Example within the Present Invention)

Using an arc ion-plating apparatus, each of test pieces for the measurement of a residual compression stress, and cemented carbide substrates having insert shapes for milling or turning was coated with TiAlN to a 1-μm thickness at a temperature of 600° C., a reaction pressure of 5.0 Pa, and a bias voltage of −50 V, and coating was continued to a 11-μm thickness in total by changing the bias voltage to a 10-kHz pulse.

Samples 2-16 (Examples within the Present Invention) and Samples 92-99 (Comparative Examples)

To examine the influence of the hard coating thickness on a residual compression stress, Samples were produced in the same manner as in Sample 1 except for changing the hard coating composition and the coating time (thickness) as shown in Table 1.

Samples 17-29 (Examples within the Present Invention) and Samples 89-91 (Comparative Examples)

To examine the influence of the hardness and heat resistance of the hard coating on cutting performance, Samples were produced in the same manner as in Sample 1 except for changing the hard coating composition as shown in Table 1.

Samples 30-38 (Examples within the Present Invention) and Samples 100-103 (Comparative Examples)

To examine the influence of oxygen or carbon contained in the hard coating on cutting performance, Samples were produced in the same manner as in Sample 1 except for changing the hard coating composition as shown in Table 1.

Samples 39-43 (Examples within the Present Invention) and Samples 106-107 (Comparative Examples)

To examine the influence of a reaction pressure during coating on a hard coating composition, Samples were produced in the same manner as in Sample 1 except for changing the reaction pressure between 1.6 Pa and 12.0 Pa as shown in Table 1.

Samples 44-47 (Examples within the Present Invention) and Samples 104-105 (Comparative Examples)

To examine the influence of a pulsed bias voltage applied during coating on the peak intensities of a (111) plane, a (200) plane and a (220) plane in the X-ray diffraction of the hard coating, Samples were produced in the same manner as in Sample 1 except for changing the pulsed bias voltage as shown in Table 1.

Samples 48-55 (Examples within the Present Invention) and Samples 108-109 (Comparative Examples)

To examine the influence of the frequency of a pulsed bias voltage applied during coating on the peak intensities of a (111) plane, a (200) plane and a (220) plane in the X-ray diffraction of the hard coating, Samples were produced in the same manner as in Sample 1 except for changing the pulse frequency in a range of 2-40 kHz as shown in Table 1.

Samples 56-58 (Examples within the Present Invention)

To examine the influence of the surface roughness of the substrate on the peak intensities of a (111) plane and a (220) plane in the X-ray diffraction of the hard coating, hard coatings were formed in the same manner as in Sample 1 except for using the as-sintered surface and ground surface of cemented carbide. Sample 56 used a substrate having a surface roughness Ra of 0.2, Sample 57 used a substrate having a surface roughness Ra of 0.5, and Sample 58 used a substrate having a surface roughness Ra of 0.7.

Samples 59-63 (Examples within the Present Invention) and Samples 110-112 (Comparative Examples)

To examine the influence of a coating temperature on the growth of crystal grains on droplets, Samples were produced in the same manner as in Sample 1 except for changing the coating temperature between 450° C. and 760° C. as shown in Table 1.

Samples 64-69 (Examples within the Present Invention)

To examine the influence of a pulsed bias voltage applied during coating on a residual compression stress and a composition variation in columnar crystal grains, Samples were produced in the same manner as in Sample 1, except for setting the bias voltage at −50 to −100 V, and changing the pulse frequency between 10 kHz and 35 kHz as shown in Table 1.

Samples 70-72 (Examples within the Present Invention)

To examine the influence of a pulsed bias voltage applied during coating on a residual compression stress, and adhesion in a scratching test, Samples were produced in the same manner as in Sample 1 except for setting the bias voltage at −50 V, the pulse frequency at 10 kHz, and changing the positive bias voltage between +5 V and +20 V as shown in Table 1.

Samples 73-75 (Examples within the Present Invention)

To confirm the cutting performance of a multi-layer hard coating in place of a single-layer hard coating, Samples were produced in the same manner as in Sample 1 except for changing the hard coating composition and the layer structure as follows. The hard coating composition of each Sample is shown by atomic % of metals only. A 5.6-μm-thick, lowermost layer of (40Ti-60Al)N and a 5.6-μm-thick, upper layer of (80Ti-20Si)N were formed in Sample 73. A 1.9-μm-thick lowermost layer of (40Cr-60Al)N and a 1.9-μm-thick upper layer of (80Ti-20Si)N were formed in Sample 74. This combination of coating was repeated three times continuously in a thickness direction to form a six-layer hard coating of 11.4 μm in total in each Sample. A combination of a lowermost layer of (40Cr-60Al)N, an intermediate layer of (80Ti-20Si)N and an outermost layer of (75Al-25Si)N were laminated three times in this order to form a 11.5-μm-thick hard coating having 9 layers in total in Samples 75.

Samples 76-79 (Examples within the Present Invention) and Sample 119 (Conventional Example)

To examine the influence of the surface conditions of the hard coating on cutting performance, each hard-coated member produced in the same manner as in Sample 1 was subjected to a wet blasting treatment by which 0.5-μm-diameter SiC powder dispersed in an aqueous solvent was blasted at pressure of 9 kgf/mm$^2$, for 30 seconds (Sample 76), for 15 seconds (Sample 77), for 10 seconds (Sample 78) and for 5 seconds (Sample 79). For comparison, a hard coating (Sample 118) obtained by CVD was subjected to a wet blasting treatment for 10 seconds under the same conditions, to produce Sample 119 (Conventional Example).

Samples 80-83 (Examples within the Present Invention)

To examine the influence of the rake angle of a turning insert on cutting performance, Samples were produced in the same manner as in Sample 1 except for changing the rake angle $\theta_1$ to 10° (Sample 80), 15° (Sample 81), 35° (Sample 82), and 40° (Sample 83). Sample 1 had a rake angle $\theta_1$ of 5°.

Samples 84 and 85 (Examples within the Present Invention)

Samples were produced in the same manner as in Sample 1, except for coating hexagonal crystal materials as outermost layers of the hard coatings to increase lubrication. Sample 84 had an outermost layer of TiB$_2$, and Sample 85 had an outermost layer of WC.

Samples 86-88 (Examples within the Present Invention)

Samples were produced in the same manner as in Sample 1, except for forming a 10-nm Ti layer (Sample 86), a 200-nm Cr layer (Sample 87), and a 210-nm TiAl alloy layer (Sample 88) as metal layers immediately on the substrates to increase adhesion.

Samples 113-115 (Conventional Examples)

Samples were produced in the same manner as in Sample 1 except for changing the composition and thickness as shown in Table 1, with a coating temperature of 450-500° C. and a DC bias voltage of −50 V, which were generally used.

Samples 116-117 (Conventional Examples)

Samples were produced in the same manner as in Sample 1 except for changing the composition and thickness as shown in Table 1, with a DC bias voltage of −100 V, a reaction pressure of 2.7 Pa, and a coating temperature of 577° C.

Sample 118 (Conventional Example)

A hard-coated sample was produced by a CVD method conventionally used to form a thick coating. By a CVD method, (1) a TiN coating was formed on a substrate at 920° C., using a hydrogen carrier gas, a titanium tetrachloride gas and a methane gas as starting material gases, (2) a TiCN coating was formed at 780° C., using 1.5% by volume of a titanium tetrachloride gas, 35% by volume of a nitrogen gas, and 1.5% by volume of an acetonitrile gas, the balance being a hydrogen gas, as starting material gases, (3) an Al$_2$O$_3$ coating was formed at 1005° C., using aluminum trichloride, a carbon dioxide gas, a carbon monoxide gas, a hydrogen gas and a hydrogen sulfide gas, and (4) a TiN coating was formed at 1005° C., using a hydrogen carrier gas, a titanium tetrachloride gas and a nitrogen gas as starting material gases.

After a test piece of each Sample was measured with respect to a residual compression stress, the test piece was vertically broken to measure its thickness by a field-emission scanning electron microscope (for instance, S-4200 available from Hitachi Ltd.). A cross section of a hard coating in each Sample was ground slantingly at 17°, and the composition of the hard coating was analyzed by measuring the ground portion by EPMA (for instance, JXA-8500R available from JEOL Ltd.) at a acceleration voltage of 10 kV and a sample current of 1.0 μA. The composition, production conditions and residual compression stress of the hard coating of each Sample are shown in Table 1.

TABLE 1

| Sample No. | Hard Coating Composition (atomic %) | Coating Thickness (μm) | Carbon Content (atomic %) | Oxygen Content (atomic %) |
|---|---|---|---|---|
| 1[1] | (50Ti—50Al)N | 11.0 | 0.00 | 0.00 |
| 2[1] | (50Ti—50Al)N | 5.7 | 0.00 | 0.00 |
| 3[1] | (50Ti—50Al)N | 8.9 | 0.00 | 0.00 |
| 4[1] | (50Ti—50Al)N | 29.8 | 0.00 | 0.00 |
| 5[1] | (50Cr—50Al)N | 11.0 | 0.00 | 0.00 |
| 6[1] | (50Cr—50Al)N | 5.8 | 0.00 | 0.00 |
| 7[1] | (50Cr—50Al)N | 8.9 | 0.00 | 0.00 |
| 8[1] | (50Cr—50Al)N | 29.8 | 0.00 | 0.00 |
| 9[1] | (50Ti—50Cr)N | 11.0 | 0.00 | 0.00 |
| 10[1] | (50Ti—50Cr)N | 6.0 | 0.00 | 0.00 |
| 11[1] | (50Ti—50Cr)N | 8.9 | 0.00 | 0.00 |
| 12[1] | (50Ti—50Cr)N | 29.8 | 0.00 | 0.00 |
| 13[1] | (80Ti—20W)N | 11.0 | 0.00 | 0.00 |
| 14[1] | (80Ti—20W)N | 5.5 | 0.00 | 0.00 |
| 15[1] | (80Ti—20W)N | 8.9 | 0.00 | 0.00 |
| 16[1] | (80Ti—20W)N | 29.8 | 0.00 | 0.00 |
| 17[1] | (66Al—34Ti)N | 11.3 | 0.00 | 0.00 |
| 18[1] | (75Al—25Ti)N | 11.6 | 0.00 | 0.00 |
| 19[1] | (80Nb—10B—10Si)N | 11.0 | 0.00 | 0.00 |
| 20[1] | (50Ti—40Al—10Nb)N | 11.0 | 0.00 | 0.00 |
| 21[1] | (40Ti—45Al—10Nb—5S)N | 11.0 | 0.00 | 0.00 |
| 22[1] | (80Ti—10V—10Si)N | 11.0 | 0.00 | 0.00 |
| 23[1] | (50Cr—40Al—10Si)N | 11.0 | 0.00 | 0.00 |
| 24[1] | (40Cr—50Al—5Si—5B)N | 11.0 | 0.00 | 0.00 |
| 25[1] | (75Ti—20Si—5B)N | 11.0 | 0.00 | 0.00 |

TABLE 1-continued

| | | | | |
|---|---|---|---|---|
| 26[1] | (40Cr—45Al—15Zr)N | 11.0 | 0.00 | 0.00 |
| 27[1] | (50Ti—40Al—10Ta)N | 11.0 | 0.00 | 0.00 |
| 28[1] | (30Cr—60Al—10W)N | 11.0 | 0.00 | 0.00 |
| 29[1] | (45Cr—45Hf—10B)N | 11.0 | 0.00 | 0.00 |
| 30[1] | (50Ti—50Al) ON | 11.0 | 0.00 | 0.32 |
| 31[1] | (50Ti—50Al) ON | 11.0 | 0.00 | 2.44 |
| 32[1] | (50Ti—50Al) ON | 11.0 | 0.00 | 9.86 |
| 33[1] | (50Ti—50Al) CN | 11.0 | 0.30 | 0.00 |
| 34[1] | (50Ti—50Al) CN | 11.0 | 3.62 | 0.00 |
| 35[1] | (50Ti—50Al) CN | 11.0 | 9.74 | 0.00 |
| 36[1] | (50Ti—50Al) CON | 11.0 | 0.51 | 0.31 |
| 37[1] | (50Ti—50Al) CON | 11.0 | 9.83 | 6.52 |
| 38[1] | (50Ti—40Al—10Nb) ON | 11.0 | 0.00 | 0.63 |
| 39[1] | (50Ti—50Al)N | 11.5 | 0.00 | 0.00 |
| 40[1] | (50Ti—50Al)N | 11.3 | 0.00 | 0.00 |
| 41[1] | (50Ti—50Al)N | 11.1 | 0.00 | 0.00 |
| 42[1] | (50Ti—50Al)N | 11.2 | 0.00 | 0.00 |
| 43[1] | (50Ti—50Al)N | 11.4 | 0.00 | 0.00 |
| 44[1] | (50Ti—50Al)N | 11.6 | 0.00 | 0.00 |
| 45[1] | (50Ti—50Al)N | 10.5 | 0.00 | 0.00 |
| 46[1] | (50Ti—50Al)N | 9.8 | 0.00 | 0.00 |
| 47[1] | (50Cr—50Al)N | 10.1 | 0.00 | 0.00 |
| 48[1] | (50Ti—50Al)N | 11.0 | 0.00 | 0.00 |
| 49[1] | (50Ti—50Al)N | 11.0 | 0.00 | 0.00 |
| 50[1] | (50Ti—50Al)N | 11.3 | 0.00 | 0.00 |
| 51[1] | (50Ti—50Al)N | 10.7 | 0.00 | 0.00 |
| 52[1] | (50Ti—50Al)N | 10.9 | 0.00 | 0.00 |
| 53[1] | (37Cr—63Al)N | 11.0 | 0.00 | 0.00 |
| 54[1] | (35Ti—50Al—15W)N | 11.2 | 0.00 | 0.00 |
| 55[1] | (30Cr—50Al—10W—10Si)N | 11.1 | 0.00 | 0.00 |
| 56[1] | (50Ti—50Al)N | 11.2 | 0.00 | 0.00 |
| 57[1] | (50Ti—50Al)N | 10.8 | 0.00 | 0.00 |
| 58[1] | (50Ti—50Al)N | 10.7 | 0.00 | 0.00 |
| 59[1] | (50Ti—50Al)N | 11.5 | 0.00 | 0.00 |
| 60[1] | (50Ti—50Al)N | 11.3 | 0.00 | 0.00 |
| 61[1] | (50Ti—50Al)N | 11.2 | 0.00 | 0.00 |
| 62[1] | (50Ti—50Al)N | 11.7 | 0.00 | 0.00 |
| 63[1] | (50Ti—50Al)N | 11.6 | 0.00 | 0.00 |
| 64[1] | (50Ti—50Al)N | 11.4 | 0.00 | 0.00 |
| 65[1] | (50Ti—50Al)N | 11.0 | 0.00 | 0.00 |
| 66[1] | (50Ti—50Al)N | 11.0 | 0.00 | 0.00 |
| 67[1] | (40Ti—50Al—10W)N | 11.0 | 0.00 | 0.00 |
| 68[1] | (50Cr—40Al—10Si)N | 11.0 | 0.00 | 0.00 |
| 69[1] | (45Ti—50Al—5Si)N | 11.1 | 0.00 | 0.00 |
| 70[1] | (50Ti—50Al)N | 11.3 | 0.00 | 0.00 |
| 71[1] | (50Ti—50Al)N | 11.2 | 0.00 | 0.00 |
| 72[1] | (50Ti—50Al)N | 11.6 | 0.00 | 0.00 |
| 73[1] | Two layers having lower (40Ti—60Al)N layer, and upper (80Ti—20Si)N layer | 11.2 | 0.00 | 0.00 |
| 74[1] | Six layers alternately having lower layers of (40Cr—60Al)N, and upper layers (80Ti—20Si)N | 11.4 | 0.00 | 0.00 |
| 75[1] | Nine layers alternately having lower (40Cr—60Al)N layers, intermediate (80Ti—20Si)N layers, and outermost (75Al—25Si)N layers | 11.5 | 0.00 | 0.00 |
| 76[1] | (50Ti—50Al)N | 12.2 | 0.00 | 0.00 |
| 77[1] | (50Ti—50Al)N | 11.7 | 0.00 | 0.00 |
| 78[1] | (50Ti—50Al)N | 11.4 | 0.00 | 0.00 |
| 79[1] | (50Ti—50Al)N | 12.2 | 0.00 | 0.00 |
| 80[1] | (50Ti—50Al)N | 10.6 | 0.00 | 0.00 |
| 81[1] | (50Ti—50Al)N | 11.1 | 0.00 | 0.00 |
| 82[1] | (50Ti—50Al)N | 11.3 | 0.00 | 0.00 |
| 83[1] | (50Ti—50Al)N | 11.2 | 0.00 | 0.00 |
| 84[1] | (50Ti—50Al)N + TiB$_2$ | 11.2 | 0.00 | 0.00 |
| 85[1] | (50Ti—50Al)N + WC | 11.1 | 0.00 | 0.00 |
| 86[1] | (50Ti—50Al)N | 10.8 | 0.00 | 0.00 |
| 87[1] | (50Ti—50Al)N | 11.1 | 0.00 | 0.00 |
| 88[1] | (50Ti—50Al)N | 11.2 | 0.00 | 0.00 |
| 89[2] | TiN | 11.0 | 0.00 | 0.00 |
| 90[2] | ZrN | 11.0 | 0.00 | 0.00 |
| 91[2] | CrN | 11.0 | 0.00 | 0.00 |
| 92[2] | (50Ti—50Al)N | 4.0 | 0.00 | 0.00 |
| 93[2] | (50Ti—50Al)N | 40.0 | 0.00 | 0.00 |
| 94[2] | (50Cr—50Al)N | 4.0 | 0.00 | 0.00 |
| 95[2] | (50Cr—50Al)N | 40.0 | 0.00 | 0.00 |
| 96[2] | (50Ti—50Cr)N | 4.0 | 0.00 | 0.00 |
| 97[2] | (50Ti—50Cr)N | 40.0 | 0.00 | 0.00 |
| 98[2] | (80Ti—20W)N | 4.0 | 0.00 | 0.00 |

TABLE 1-continued

| Sample No. | | | | | | |
|---|---|---|---|---|---|---|
| 99[2] | (80Ti—20W)N | 40.0 | 0.00 | 0.00 | | |
| 100[2] | (50Ti—50Al) ON | 11.0 | 0.00 | 10.10 | | |
| 101[2] | (50Ti—50Al) ON | 11.0 | 0.00 | 15.50 | | |
| 102[2] | (50Ti—50Al) CN | 11.0 | 10.20 | 0.00 | | |
| 103[2] | (50Ti—50Al) CN | 11.0 | 14.40 | 0.00 | | |
| 104[2] | (50Ti—50Al)N | 10.2 | 0.00 | 0.00 | | |
| 105[2] | (50Ti—50Al)N | 11.3 | 0.00 | 0.00 | | |
| 106[2] | (50Ti—50Al)N | 9.6 | 0.00 | 0.00 | | |
| 107[2] | (50Ti—50Al)N | 9.5 | 0.00 | 0.00 | | |
| 108[2] | (50Ti—50Al)N | 11.2 | 0.00 | 0.00 | | |
| 109[2] | (50Ti—50Al)N | 11.5 | 0.00 | 0.00 | | |
| 110[2] | (50Ti—50Al)N | 11.1 | 0.00 | 0.00 | | |
| 111[2] | (50Ti—50Al)N | 11.4 | 0.00 | 0.00 | | |
| 112[2] | (50Ti—50Al)N | 11.5 | 0.00 | 0.00 | | |
| 113[3] | TiN + (50Ti—50Al)N + TiN | 4.5 | 0.00 | 0.00 | | |
| 114[3] | (50Ti—50Al)N | 7.0 | 0.00 | 0.00 | | |
| 115[3] | (50Ti—40Al—10Si)N | 11.8 | 0.00 | 0.00 | | |
| 116[3] | (13Ti—17Cr—66Al—4Si)N | 3.0 | 0.00 | 0.00 | | |
| 117[3] | (13Ti—17Cr—66Al—4Si)N | 10.0 | 0.00 | 0.00 | | |
| 118[3] | TiN—TiCN—Al$_2$O$_3$—TiN | 12.6 | — | — | | |
| 119[3] | TiN—TiCN—Al$_2$O$_3$—TiN Surface-worked after coating | 12.6 | — | — | | |

| Sample No. | Bias Voltage (V) | Pulse Frequency (kHz) | Positive Bias Voltage (V) | Reaction Pressure (Pa) | Coating Temp. (° C.) | Residual Compression Stress (GPa) |
|---|---|---|---|---|---|---|
| 1[1] | −50 | 10 | No | 5.0 | 600 | 2.4 |
| 2[1] | −50 | 10 | No | 5.0 | 600 | 1.8 |
| 3[1] | −50 | 10 | No | 5.0 | 600 | 2.8 |
| 4[1] | −50 | 10 | No | 5.0 | 600 | 5.9 |
| 5[1] | −50 | 10 | No | 5.0 | 600 | 3.7 |
| 6[1] | −50 | 10 | No | 5.0 | 600 | 1.9 |
| 7[1] | −50 | 10 | No | 5.0 | 600 | 2.4 |
| 8[1] | −50 | 10 | No | 5.0 | 600 | 5.8 |
| 9[1] | −50 | 10 | No | 5.0 | 600 | 3.9 |
| 10[1] | −50 | 10 | No | 5.0 | 600 | 1.6 |
| 11[1] | −50 | 10 | No | 5.0 | 600 | 3.1 |
| 12[1] | −50 | 10 | No | 5.0 | 600 | 5.8 |
| 13[1] | −50 | 10 | No | 5.0 | 600 | 3.9 |
| 14[1] | −50 | 10 | No | 5.0 | 600 | 1.6 |
| 15[1] | −50 | 10 | No | 5.0 | 600 | 2.6 |
| 16[1] | −50 | 10 | No | 5.0 | 600 | 5.7 |
| 17[1] | −50 | 10 | No | 5.0 | 600 | 4.4 |
| 18[1] | −50 | 10 | No | 5.0 | 600 | 3.2 |
| 19[1] | −50 | 10 | No | 5.0 | 600 | 2.6 |
| 20[1] | −50 | 10 | No | 5.0 | 600 | 3.2 |
| 21[1] | −50 | 10 | No | 5.0 | 600 | 3.0 |
| 22[1] | −50 | 10 | No | 5.0 | 600 | 2.9 |
| 23[1] | −50 | 10 | No | 5.0 | 600 | 3.2 |
| 24[1] | −50 | 10 | No | 5.0 | 600 | 2.7 |
| 25[1] | −50 | 10 | No | 5.0 | 600 | 3.1 |
| 26[1] | −50 | 10 | No | 5.0 | 600 | 2.6 |
| 27[1] | −50 | 10 | No | 5.0 | 600 | 2.8 |
| 28[1] | −50 | 10 | No | 5.0 | 600 | 3.6 |
| 29[1] | −50 | 10 | No | 5.0 | 600 | 3.4 |
| 30[1] | −50 | 10 | No | 5.0 | 600 | 3.4 |
| 31[1] | −50 | 10 | No | 5.0 | 600 | 2.9 |
| 32[1] | −50 | 10 | No | 5.0 | 600 | 3.6 |
| 33[1] | −50 | 10 | No | 5.0 | 600 | 4.2 |
| 34[1] | −50 | 10 | No | 5.0 | 600 | 4.1 |
| 35[1] | −50 | 10 | No | 5.0 | 600 | 4.6 |
| 36[1] | −50 | 10 | No | 5.0 | 600 | 5.1 |
| 37[1] | −50 | 10 | No | 5.0 | 600 | 5.3 |
| 38[1] | −50 | 10 | No | 5.0 | 600 | 5.5 |
| 39[1] | −50 | 10 | No | 3.5 | 600 | 3.5 |
| 40[1] | −50 | 10 | No | 6.2 | 600 | 2.7 |
| 41[1] | −50 | 10 | No | 8.9 | 600 | 2.1 |
| 42[1] | −50 | 10 | No | 10.8 | 600 | 1.6 |
| 43[1] | −50 | 10 | No | 11.0 | 600 | 1.0 |
| 44[1] | −100 | 10 | No | 5.0 | 600 | 5.6 |
| 45[1] | −80 | 10 | No | 5.0 | 600 | 5.0 |
| 46[1] | −60 | 10 | No | 5.0 | 600 | 3.5 |
| 47[1] | −20 | 10 | No | 5.0 | 600 | 1.6 |
| 48[1] | −50 | 5 | No | 5.0 | 600 | 2.5 |
| 49[1] | −50 | 15 | No | 5.0 | 600 | 2.9 |
| 50[1] | −50 | 20 | No | 5.0 | 600 | 3.1 |
| 51[1] | −50 | 25 | No | 5.0 | 600 | 3.6 |
| 52[1] | −50 | 30 | No | 5.0 | 600 | 3.9 |
| 53[1] | −50 | 35 | No | 5.0 | 600 | 5.9 |

TABLE 1-continued

| Sample | | | | | | |
|---|---|---|---|---|---|---|
| 54[1] | −50 | 10 | No | 5.0 | 600 | 2.6 |
| 55[1] | −50 | 10 | No | 5.0 | 600 | 3.0 |
| 56[1] | −50 | 10 | No | 5.0 | 600 | 2.7 |
| 57[1] | −50 | 10 | No | 5.0 | 600 | 3.2 |
| 58[1] | −50 | 10 | No | 5.0 | 600 | 3.6 |
| 59[1] | −50 | 10 | No | 5.0 | 550 | 5.8 |
| 60[1] | −50 | 10 | No | 5.0 | 570 | 3.1 |
| 61[1] | −50 | 10 | No | 5.0 | 590 | 2.1 |
| 62[1] | −50 | 10 | No | 5.0 | 650 | 1.9 |
| 63[1] | −50 | 10 | No | 5.0 | 740 | 1.6 |
| 64[1] | −60 | 10 | No | 5.0 | 600 | 1.0 |
| 65[1] | −80 | 20 | No | 5.0 | 600 | 1.6 |
| 66[1] | −100 | 35 | No | 5.0 | 600 | 2.1 |
| 67[1] | −100 | 10 | No | 5.0 | 600 | 2.1 |
| 68[1] | −100 | 10 | No | 5.0 | 600 | 2.2 |
| 69[1] | −100 | 10 | No | 5.0 | 600 | 6.0 |
| 70[1] | −50 | 10 | 5 | 5.0 | 600 | 2.0 |
| 71[1] | −50 | 10 | 10 | 5.0 | 600 | 2.0 |
| 72[1] | −50 | 10 | 20 | 5.0 | 600 | 2.0 |
| 73[1] | −50 | 10 | No | 5.0 | 600 | 3.6 |
| 74[1] | −80 | 10 | No | 3.7 | 600 | 3.4 |
| 75[1] | −120 | 10 | No | 3.7 | 600 | 5.8 |
| 76[1] | −50 | 10 | No | 5.0 | 600 | 2.5 |
| 77[1] | −50 | 10 | No | 5.0 | 600 | 2.4 |
| 78[1] | −50 | 10 | No | 5.0 | 600 | 2.7 |
| 79[1] | −50 | 10 | No | 5.0 | 600 | 2.6 |
| 80[1] | −50 | 10 | No | 5.0 | 600 | 2.4 |
| 81[1] | −50 | 10 | No | 5.0 | 600 | 2.5 |
| 82[1] | −50 | 10 | No | 5.0 | 600 | 2.3 |
| 83[1] | −50 | 10 | No | 5.0 | 600 | 2.4 |
| 84[1] | −50 | 10 | No | 5.0 | 600 | 2.5 |
| 85[1] | −50 | 10 | No | 5.0 | 600 | 1.3 |
| 86[1] | −50 | 10 | No | 5.0 | 600 | 1.9 |
| 87[1] | −50 | 10 | No | 5.0 | 600 | 1.5 |
| 88[1] | −50 | 10 | No | 5.0 | 600 | 1.2 |
| 89[2] | −50 | 10 | No | 5.0 | 600 | 2.9 |
| 90[2] | −50 | 10 | No | 5.0 | 600 | 1.8 |
| 91[2] | −50 | 10 | No | 5.0 | 600 | 1.9 |
| 92[2] | −50 | 10 | No | 5.0 | 600 | 1.6 |
| 93[2] | −50 | 10 | No | 5.0 | 600 | 6.7 |
| 94[2] | −50 | 10 | No | 5.0 | 600 | 1.8 |
| 95[2] | −50 | 10 | No | 5.0 | 600 | 6.2 |
| 96[2] | −50 | 10 | No | 5.0 | 600 | 1.4 |
| 97[2] | −50 | 10 | No | 5.0 | 600 | 6.9 |
| 98[2] | −50 | 10 | No | 5.0 | 600 | 1.4 |
| 99[2] | −50 | 10 | No | 5.0 | 600 | 6.6 |
| 100[2] | −50 | 10 | No | 5.0 | 600 | 6.3 |
| 101[2] | −50 | 10 | No | 5.0 | 600 | 6.9 |
| 102[2] | −50 | 10 | No | 5.0 | 600 | 6.5 |
| 103[2] | −50 | 10 | No | 5.0 | 600 | 7.6 |
| 104[2] | −120 | 10 | No | 5.0 | 600 | 7.2 |
| 105[2] | −200 | 10 | No | 5.0 | 600 | 8.1 |
| 106[2] | −50 | 10 | No | 1.6 | 600 | 7.5 |
| 107[2] | −50 | 10 | No | 12.0 | 600 | 0.2 |
| 108[2] | −50 | 40 | No | 5.0 | 600 | 6.2 |
| 109[2] | −50 | 2 | No | 5.0 | 600 | 0.9 |
| 110[2] | −50 | 10 | No | 5.0 | 450 | 6.4 |
| 111[2] | −50 | 10 | No | 5.0 | 500 | 5.8 |
| 112[2] | −50 | 10 | No | 5.0 | 760 | 1.6 |
| 113[3] | −50 | No | No | 5.0 | 450 | 4.3 |
| 114[3] | −50 | No | No | 2.6 | 500 | 6.2 |
| 115[3] | −50 | No | No | 2.6 | 500 | 6.8 |
| 116[3] | −100 | No | No | 2.7 | 577 | 3.3 |
| 117[3] | −100 | No | No | 2.7 | 577 | 6.5 |
| 118[3] | CVD | — | — | — | 900-1000 | Tensile |
| 119[3] | CVD | — | — | — | 900-1000 | Tensile |

Note:
[1] Example within the present invention.
[2] Comparative Example.
[3] Conventional Example.

The peak intensities of a (111) plane, a (200) plane and a (220) plane in the X-ray diffraction of the hard coating of each Sample were measured by a 2θ-θ scanning method in a 2θ range from 10° to 145°, using an X-ray diffraction apparatus (RU-200BH available from Rigaku Denki Co., Ltd.). CuKα1 rays ($\lambda=0.15405$ nm) were used as an X-ray source, and background noises were removed by software contained in the apparatus. The measurement revealed that the detected 2θ peak positions in Samples 1 and 17-55 (Examples within the present invention), Samples 100-112 (Comparative Examples) and Samples 114-117 (Conventional Examples) were substantially identical to those in the X-ray diffraction pattern (JCPDS File No. 38-1420) of TiN having a face-centered cubic crystal structure. Accordingly, the peak intensities of the (111) plane, the (200) plane and the (220) plane were measured. In the case of a CrN-based hard coating, too, the peak intensities were similarly measured. The results are shown in Table 2.

TABLE 2

| Sample No. | Coating Thickness (μm) | Peak Intensity Ratios $I_s/I_r$ | $I_l/I_r$ | Half-Value of (200) Plane (°) | Element Content Ratio α | Note |
|---|---|---|---|---|---|---|
| 1[1] | 11.0 | 4.6 | 0.7 | 0.6 | 1.05 | — |
| 17[1] | 11.3 | 4.7 | 0.3 | 0.5 | 1.21 | — |
| 18[1] | 11.6 | 3.2 | 0.5 | 0.6 | 1.16 | — |
| 19[1] | 11.0 | 2.6 | 0.7 | 0.4 | 1.11 | — |
| 20[1] | 11.0 | 3.7 | 0.5 | 0.5 | 1.05 | — |
| 21[1] | 11.0 | 4.4 | 0.5 | 0.6 | 0.96 | — |
| 22[1] | 11.0 | 4.8 | 0.4 | 0.7 | 0.9 | — |
| 23[1] | 11.0 | 5.1 | 0.8 | 0.4 | 1.07 | — |
| 24[1] | 11.0 | 6.6 | 0.5 | 0.4 | 1.1 | — |
| 25[1] | 11.0 | 2.4 | 0.3 | 0.6 | 1.2 | — |
| 26[1] | 11.0 | 3.7 | 0.7 | 0.7 | 0.9 | — |
| 27[1] | 11.0 | 2.2 | 0.4 | 0.4 | 1.07 | — |
| 28[1] | 11.0 | 4.3 | 0.8 | 0.5 | 1.11 | — |
| 29[1] | 11.0 | 5.7 | 0.9 | 0.7 | 1.18 | — |
| 30[1] | 11.0 | 4.4 | 0.3 | 0.4 | 1.1 | — |
| 31[1] | 11.0 | 3.1 | 0.4 | 0.5 | 1.12 | — |
| 32[1] | 11.0 | 2.5 | 0.5 | 0.7 | 1.17 | — |
| 33[1] | 11.0 | 5.4 | 0.4 | 0.4 | 1.1 | — |
| 34[1] | 11.0 | 4.4 | 0.5 | 0.5 | 1.15 | — |
| 35[1] | 11.0 | 2.4 | 0.7 | 0.7 | 1.2 | — |
| 36[1] | 11.0 | 4.1 | 0.5 | 0.4 | 1.15 | — |
| 37[1] | 11.0 | 2.4 | 0.8 | 0.7 | 1.22 | — |
| 38[1] | 11.0 | 4.6 | 0.5 | 0.4 | 1.11 | — |
| 39[1] | 11.5 | 2.4 | 0.4 | 0.6 | 0.90 | — |
| 40[1] | 11.3 | 5 | 0.7 | 0.5 | 1.12 | — |
| 41[1] | 11.1 | 5.8 | 0.8 | 0.4 | 1.13 | — |
| 42[1] | 11.2 | 6 | 0.9 | 0.4 | 1.17 | — |
| 43[1] | 11.4 | 6.5 | 1 | 0.4 | 1.25 | — |
| 44[1] | 11.6 | 2.5 | 0.2 | 0.7 | 0.95 | — |
| 45[1] | 10.5 | 3.6 | 0.5 | 0.7 | 0.97 | — |
| 46[1] | 9.8 | 2.9 | 0.7 | 0.6 | 1.03 | — |
| 47[1] | 10.1 | 6.9 | 1 | 0.5 | 1.16 | — |
| 48[1] | 11.0 | 4.3 | 0.95 | 0.4 | 1.2 | — |
| 49[1] | 11.0 | 4 | 0.84 | 0.4 | 1.15 | — |
| 50[1] | 11.3 | 3.3 | 0.8 | 0.6 | 1.1 | — |
| 51[1] | 10.7 | 2.9 | 0.72 | 0.6 | 1.05 | — |
| 52[1] | 10.9 | 2.2 | 0.66 | 0.7 | 1 | — |
| 53[1] | 11.0 | 2.4 | 0.29 | 0.7 | 1.1 | — |
| 54[1] | 11.2 | 6.2 | 0.88 | 0.7 | 1.2 | — |
| 55[1] | 11.1 | 3.2 | 0.51 | 0.7 | 1.2 | — |
| 100[2] | 11.0 | 3.4 | 0.2 | 1.1 | 1.15 | (4) |
| 101[2] | 11.0 | 2.6 | 0.3 | 1.2 | 1.13 | (4) |
| 102[2] | 11.0 | 3.1 | 0.2 | 1.2 | 1.17 | (4) |
| 103[2] | 11.0 | 2.4 | 0.3 | 1.2 | 1.21 | (4) |
| 104[2] | 10.2 | 1.2 | 0.1 | 0.9 | 1.05 | (5) |
| 105[2] | 11.3 | 0.6 | 0.1 | 1 | 0.95 | (5) |
| 106[2] | 9.6 | 1.4 | 0.1 | 1 | 1.05 | (5) |
| 107[2] | 9.5 | 7.8 | 1.5 | 0.4 | 1.32 | (6) |
| 108[2] | 11.2 | 4.5 | 0.1 | 0.7 | 1.05 | (7) |
| 109[2] | 11.5 | 6.2 | 1.07 | 0.4 | 1.15 | (6) |
| 110[2] | 11.1 | 5.6 | 0.3 | 0.8 | 1.15 | (8) |
| 111[2] | 11.4 | 4.2 | 0.4 | 0.6 | 1.12 | — |
| 112[2] | 11.5 | 2.3 | 0.7 | 0.4 | 0.95 | — |
| 114[3] | 7.0 | 4.4 | 0.1 | 0.6 | 0.9 | (9) |
| 115[3] | 11.8 | 3.6 | 0.1 | 0.9 | 1.05 | (9) |
| 116[3] | 3.0 | 0.9 | 0.3 | 0.8 | 1.02 | (10) |
| 117[3] | 10.0 | 1.1 | 0.2 | 0.9 | 1.12 | (11) |

Note:
[1]Example within the present invention.
[2]Comparative Example.
[3]Conventional Example.
(4) Rapidly worn.
(5) Chipping occurred before the expiration of life.
(6) Prematurely worn.
(7) Chipping occurred at cutting edge in 10 minutes.
(8) Chipping occurred prematurely.
(9) Coating on a cutting edge was damaged and then broken.
(10) Largely worn from the early stage of cutting.
(11) Chipping occurred at cutting edge in the course of cutting.

With the resultant turning insert attached to an insert-exchanging tool, turning was conducted under the following conditions to evaluate wear resistance, chipping resistance and adhesion. The wear was evaluated by observing the hard coating on the flank and rake face of the insert by an optical microscope (magnification: 50 times) when 5 minutes passed after cutting started. Continuing cutting, a tool life was evaluated by measuring the cutting time (minutes) until damage (including small chipping of 10 μm or more) occurred. The results are shown in Tables 3-15.

Cutting Conditions

| Tool | Insert-exchanging tool, |
|---|---|
| Insert | CNMG432 type having a special shape with a chip breaker, |
| Cutting method | Cutting of an outer surface in a longitudinal direction, |
| Work | Round rod having a diameter of 160 mm and a length of 600 mm, |
| Work material | S53C (260HB, heat-treated), |
| Cutting depth | 2.0 mm, |
| Cutting speed | 220 m/min, |
| Feed per one rotation | 0.4 mm/rev, and |
| Cutting oil | Not used. |

TABLE 3

| Sample No. | Hard Coating Composition (atomic %) | Coating Thickness (μm) | Residual Compression Stress (GPa) | Tool Life (min) | Note |
|---|---|---|---|---|---|
| 1[1] | (50Ti—50Al)N | 11.0 | 2.4 | 24.4 | — |
| 2[1] | (50Ti—50Al)N | 5.7 | 1.8 | 21.2 | — |
| 3[1] | (50Ti—50Al)N | 8.9 | 2.8 | 22.5 | — |
| 4[1] | (50Ti—50Al)N | 29.8 | 5.9 | 18.2 | — |
| 5[1] | (50Cr—50Al)N | 11.0 | 3.7 | 26.2 | — |
| 6[1] | (50Cr—50Al)N | 5.8 | 1.9 | 21.2 | — |
| 7[1] | (50Cr—50Al)N | 8.9 | 2.4 | 23.3 | — |
| 8[1] | (50Cr—50Al)N | 29.8 | 5.8 | 17.7 | — |
| 9[1] | (50Ti—50Cr)N | 11.0 | 3.9 | 22.4 | — |
| 10[1] | (50Ti—50Cr)N | 6.0 | 1.6 | 20.6 | — |
| 11[1] | (50Ti—50Cr)N | 8.9 | 3.1 | 21.2 | — |

TABLE 3-continued

| Sample No. | Hard Coating Composition (atomic %) | Coating Thickness (μm) | Residual Compression Stress (GPa) | Tool Life (min) | Note |
|---|---|---|---|---|---|
| 12(1) | (50Ti—50Cr)N | 29.8 | 5.8 | 16.8 | — |
| 13(1) | (80Ti—20W)N | 11.0 | 3.9 | 23.5 | — |
| 14(1) | (80Ti—20W)N | 5.5 | 1.6 | 20.7 | — |
| 15(1) | (80Ti—20W)N | 8.9 | 2.6 | 21.1 | — |
| 16(1) | (80Ti—20W)N | 29.8 | 5.7 | 17.2 | — |
| 92(2) | (50Ti—50Al)N | 4.0 | 1.6 | 14.4 | (6) |
| 93(2) | (50Ti—50Al)N | 40.0 | 6.7 | 13.2 | (8) |
| 94(2) | (50Cr—50Al)N | 4.0 | 1.8 | 15.2 | (6) |
| 95(2) | (50Cr—50Al)N | 40.0 | 6.2 | 12.2 | (8) |
| 96(2) | (50Ti—50Cr)N | 4.0 | 1.4 | 11.4 | (6) |
| 97(2) | (50Ti—50Cr)N | 40.0 | 6.9 | 10.6 | (8) |
| 98(2) | (80Ti—20W)N | 4.0 | 1.4 | 12.4 | (6) |
| 99(2) | (80Ti—20W)N | 40.0 | 6.6 | 11.3 | (8) |
| 113(3) | TiN + (50Ti—50Al)N + TiN | 4.5 | 4.3 | 8.1 | (12) |
| 114(3) | (50Ti—50Al)N | 7.0 | 6.2 | 9.6 | (9) |
| 115(3) | (50Ti—40Al—10Si)N | 11.8 | 6.8 | 10.2 | (9) |
| 116(3) | (13Ti—17Cr—66Al—4Si)N | 3.0 | 3.3 | 5.2 | (10) |
| 117(3) | (13Ti—17Cr—66Al—4Si)N | 10.0 | 6.5 | 9.8 | (11) |
| 118(3) | TiN—TiCN—$Al_2O_3$—TiN | 12.6 | Tensile | 6.7 | (9) |

Note:
(1)Example within the present invention.
(2)Comparative Example.
(3)Conventional Example.
(6) Prematurely worn.
(8) Chipping occurred prematurely.
(9) Coating on a cutting edge was damaged and then broken.
(10) Largely worn from the early stage of cutting.
(11) Chipping occurred at cutting edge in the course of cutting.
(12) Prematurely worn with large deposition.

The influence of the thickness was evaluated, and the results are shown in Table 3. Samples 1-16 (Examples within the Present Invention) and Samples 92-99 (Comparative Examples) show that the thicker the hard coating, the larger the residual compression stress. The 5.7-μm-thick hard coating of Sample 2 (Example within the present invention) had a residual compression stress of 1.8 GPa and a tool life of 21.2 minutes, better than those of the CVD-coated insert of Sample 118 (Conventional Example). The measurement of wear at the cutting edge at a cutting time of 5 minutes revealed that the wear of a flank was 0.102 mm in Sample 118 (Conventional Example) and 0.084 mm in Sample 2 (Example within the present invention). At a thickness of less than 5 μm, as is clear from Samples 92, 94, 96 and 98 (Comparative Examples), their tool lives were poorer than that of the CVD-coated insert of Sample 118 (Conventional Example), even though they had low residual compression stress. This appears to be due to the fact that they had poorer abrasive wear resistance than that of the CVD coating having a thickness of 10 μm or more. However, the hard PVD coatings of Samples 1-16 (Examples within the Present Invention) each having a thickness of 5 μm or more were higher in wear resistance than the CVD hard coating of Sample 118 (Conventional Example), and the hard coatings of Samples 113-117 (Conventional Examples) formed by a conventional PVD method. However, the 40-μm-thick hard coatings of Samples 93, 95, 97 and 99 (Comparative Examples) had residual compression stress of 6.7 GPa, 6.2 GPa, 6.9 GPa and 6.6 GPa, respectively. In addition, all Samples had shorter tool lives than that of Sample 1 (Example within the present invention). In Samples 93, 95, 97 and 99 (Comparative Examples), the failure of coatings on cutting edge was observed even before cutting. The observation of the damage of cutting edge during cutting revealed that coatings were broken at insert edges in a width of 10 μm or more. These broken portions appear to have led to damage. The short tool lives of Samples 69, 71, 73 and 75 (Comparative Examples) appear to be due to the fact that increase in the coating thickness led to an extremely high residual compression stress.

TABLE 4

| Sample No. | Hard Coating Composition (atomic %) | Coating Thickness (μm) | Residual Compression Stress (GPa) | Carbon Content (atomic %) | Oxygen Content (atomic %) |
|---|---|---|---|---|---|
| 1(1) | (50Ti—50Al)N | 11.0 | 2.4 | 0.00 | 0.00 |
| 17(1) | (66Al—34Ti)N | 11.3 | 4.4 | 0.00 | 0.00 |
| 18(1) | (75Al—25Ti)N | 11.6 | 3.2 | 0.00 | 0.00 |
| 19(1) | (80Nb—10B—10Si)N | 11.0 | 2.6 | 0.00 | 0.00 |
| 20(1) | (50Ti—40Al—10Nb)N | 11.0 | 3.2 | 0.00 | 0.00 |
| 21(1) | (40Ti—45Al—10Nb—5S)N | 11.0 | 3.0 | 0.00 | 0.00 |
| 22(1) | (80Ti—10V—10Si)N | 11.0 | 2.9 | 0.00 | 0.00 |
| 23(1) | (50Cr—40Al—10Si)N | 11.0 | 3.2 | 0.00 | 0.00 |
| 24(1) | (40Cr—50Al—5Si—5B)N | 11.0 | 2.7 | 0.00 | 0.00 |
| 25(1) | (75Ti—20Si—5B)N | 11.0 | 3.1 | 0.00 | 0.00 |
| 26(1) | (40Cr—45Al—15Zr)N | 11.0 | 2.6 | 0.00 | 0.00 |
| 27(1) | (50Ti—40Al—10Ta)N | 11.0 | 2.8 | 0.00 | 0.00 |

TABLE 4-continued

| Sample No. | Composition | | | | |
|---|---|---|---|---|---|
| 28[1] | (30Cr—60Al—10W)N | 11.0 | 3.6 | 0.00 | 0.00 |
| 29[1] | (45Cr—45Hf—10B)N | 11.0 | 3.4 | 0.00 | 0.00 |
| 30[1] | (50Ti—50Al) ON | 11.0 | 3.4 | 0.00 | 0.32 |
| 31[1] | (50Ti—50Al) ON | 11.0 | 2.9 | 0.00 | 2.44 |
| 32[1] | (50Ti—50Al) ON | 11.0 | 3.6 | 0.00 | 9.86 |
| 33[1] | (50Ti—50Al) CN | 11.0 | 4.2 | 0.30 | 0.00 |
| 34[1] | (50Ti—50Al) CN | 11.0 | 4.1 | 3.62 | 0.00 |
| 35[1] | (50Ti—50Al) CN | 11.0 | 4.6 | 9.74 | 0.00 |
| 36[1] | (50Ti—50Al) CON | 11.0 | 5.1 | 0.51 | 0.31 |
| 37[1] | (50Ti—50Al) CON | 11.0 | 5.3 | 9.83 | 6.52 |
| 38[1] | (50Ti—40Al—10Nb) ON | 11.0 | 5.5 | 0.00 | 0.63 |
| 89[2] | TiN | 11.0 | 2.9 | 0.00 | 0.00 |
| 90[2] | ZrN | 11.0 | 1.8 | 0.00 | 0.00 |
| 91[2] | CrN | 11.0 | 1.9 | 0.00 | 0.00 |
| 100[2] | (50Ti—50Al) ON | 11.0 | 6.3 | 0.00 | 10.1 |
| 101[2] | (50Ti—50Al) ON | 11.0 | 6.9 | 0.00 | 15.5 |
| 102[2] | (50Ti—50Al) CN | 11.0 | 6.5 | 10.20 | 0.00 |
| 103[2] | (50Ti—50Al) CN | 11.0 | 7.6 | 14.40 | 0.00 |
| 113[3] | TiN + (50Ti—50Al)N + TiN | 4.5 | 4.3 | 0.00 | 0.00 |
| 114[3] | (50Ti—50Al)N | 7.0 | 6.2 | 0.00 | 0.00 |
| 115[3] | (50Ti—40Al—10Si)N | 11.8 | 6.8 | 0.00 | 0.00 |
| 116[3] | (13Ti—17Cr—66Al—4Si)N | 3.0 | 3.3 | 0.00 | 0.00 |
| 117[3] | (13Ti—17Cr—66Al—4Si)N | 10.0 | 6.5 | 0.00 | 0.00 |
| 118[3] | TiN—TiCN—Al$_2$O$_3$—TiN | 12.6 | Tensile | — | — |

| Sample No. | Tool Life (min) | Note |
|---|---|---|
| 1[1] | 24.4 | — |
| 17[1] | 22.1 | — |
| 18[1] | 20.6 | — |
| 19[1] | 18.7 | — |
| 20[1] | 26.7 | — |
| 21[1] | 28.4 | — |
| 22[1] | 18.4 | — |
| 23[1] | 27.2 | — |
| 24[1] | 28.1 | — |
| 25[1] | 19.2 | — |
| 26[1] | 24.6 | — |
| 27[1] | 26.2 | — |
| 28[1] | 26.9 | — |
| 29[1] | 19.9 | — |
| 30[1] | 27.8 | — |
| 31[1] | 26.6 | — |
| 32[1] | 25.1 | — |
| 33[1] | 25.2 | — |
| 34[1] | 26.3 | — |
| 35[1] | 27.4 | — |
| 36[1] | 28.1 | — |
| 37[1] | 28.3 | — |
| 38[1] | 29.4 | — |
| 89[2] | 9.6 | (4) |
| 90[2] | 10.2 | (4) |
| 91[2] | 11.4 | (4) |
| 100[2] | 16.6 | (4) |
| 101[2] | 10.2 | (4) |
| 102[2] | 13.7 | (4) |
| 103[2] | 8.2 | (4) |
| 113[3] | 8.1 | (12) |
| 114[3] | 9.6 | (9) |
| 115[3] | 10.2 | (9) |
| 116[3] | 5.2 | (10) |
| 117[3] | 9.8 | (11) |
| 118[3] | 6.7 | (9) |

Note:
[1]Example within the present invention.
[2]Comparative Example.
[3]Conventional Example.
(4) Rapidly worn.
(9) Coating on a cutting edge was damaged and then broken.
(10) Largely worn from the early stage of cutting.
(11) Chipping occurred at cutting edge in the course of cutting.
(12) Prematurely worn with large deposition.

The influence of the hardness and heat resistance of the hard coating on cutting performance was investigated, and the results are shown in Table 4. The tool lives of the hard coatings of Samples 1 and 17-29 (Examples within the present invention) having extremely high heat resistance and hardness, which were made of nitrides comprising at least one element Me selected from Groups 4a, 5a and 6a, and at least one element X selected from the group consisting of Al, Si, B and S, were 2.7 times or more that of the CVD hard coating of Sample 118 (Conventional Example). They were also 1.8 times or more those of the hard PVD coatings of Samples 113-117 (Conventional Examples). Further, they were as long as 1.6 times or more those of the hard PVD coatings of Samples 89-91 (Comparative Examples). It is thus clear that the hard-coated members of the present invention, in which the residual compression stress and mechanical properties of the hard coatings are controlled, have much longer tool lives than those of Samples 89-91 (Comparative Examples) and Samples 113-117 (Conventional Examples). With respect to Sample 21 (Example within the present invention) having the longest tool life among Examples, cutting edge conditions were observed during a cutting operation. As a result, no chipping was observed in the cutting edge, with the flank worn by 0.045 mm. Also, substantially no deposition of the work occurred on a cutting region, with only normal wear until the expiration of life. No deposition is attributable to the fact that the hard coating containing S had excellent lubrication. A similar tendency was observed in the hard coating of Sample 24 (Example within the present invention) containing B.

The measurement of the hard coating structure of Sample 18 (Example within the present invention) revealed that it contained both face-centered cubic crystals and hexagonal close-packed crystals. The hard coating of Sample 18 (Example within the present invention) had Vickers hardness of about 2,600, softer than the hard coatings of Sample 1 (Example within the present invention), etc. However the observation of cutting edge damage during a cutting operation revealed that the hard coating of Sample 18 suffered little deposition of a work. It is considered that the hard coating containing hexagonal close-packed crystals has increased lubrication.

As in Samples 30-38 (Examples within the Present Invention) shown in Table 4, the inclusion of O or C provides high lubrication to the hard coating. The inclusion of excess C or O degrades the mechanical strength of the hard coating. Namely, when the amount of C or O exceeds 10 atomic %, crystals become finer, and grain boundaries have larger defects in the hard coating, resulting in larger residual compression stress and lower adhesion and chipping resistance. Accordingly, both elements are preferably 10 atomic % or less based on the entire elements constituting the hard coating, to provide the hard coating with excellent deposition resistance and slidability. A cross section observation revealed that the hard coatings of Samples 30-38 (Examples within the present invention) had a columnar crystal structure. This appears to provide the hard coating with excellent mechanical strength and tool life. The observation of cutting edge in the course of cutting evaluation revealed that Samples 30-38 (Examples within the Present Invention) had excellent wear resistance in flanks, with little crater wear in rake faces. At a cutting time of 5 minutes, the hard coating containing no O and C in Sample 1 (Example within the present invention) had a crater wear width of 0.116 mm, while the hard coatings containing O or C in Samples 30, 34 and 36 (Examples within the present invention) had crater wear width of 0.074 mm, 0.084 mm and 0.080 mm, respectively, better than Sample 1 (Example within the present invention). In general, the crater wear appears to be caused by a chemical reaction due to cutting temperature elevation. It is considered that because the inclusion of O or C reduces the friction coefficient of a hard coating, the cutting temperature elevation is suppressed when chips slide a tool rake face, resulting in reduced crater wear. The measurement of a friction coefficient by a ball-on-disc method, in which a 6-mm-diameter ball of SUS304 slid on a coated cemented carbide disc without lubrication at 750° C. in the air, revealed that the hard coating containing O and C in Samples 36 (Example within the present invention) had a friction coefficient of about 0.4, half of the friction coefficient of 0.8 in Sample 1 (Example within the present invention).

TABLE 5

| Sample No. | Hard Coating Composition (atomic %) | Coating Thickness (μm) | Reaction Pressure (Pa) | Element Content Ratio α | Residual Compression Stress (GPa) | Tool Life (min) | Note |
|---|---|---|---|---|---|---|---|
| 1[1] | (50Ti—50Al)N | 11.0 | 5.0 | 1.05 | 2.4 | 24.4 | — |
| 39[1] | (50Ti—50Al)N | 11.5 | 3.5 | 0.90 | 3.5 | 20.6 | — |
| 40[1] | (50Ti—50Al)N | 11.3 | 6.2 | 1.12 | 2.7 | 22.2 | — |
| 41[1] | (50Ti—50Al)N | 11.1 | 8.9 | 1.13 | 2.1 | 25.0 | — |
| 42[1] | (50Ti—50Al)N | 11.2 | 10.8 | 1.17 | 1.6 | 25.5 | — |
| 43[1] | (50Ti—50Al)N | 11.4 | 11.0 | 1.25 | 1.0 | 21.2 | — |
| 106[2] | (50Ti—50Al)N | 9.6 | 1.6 | 1.05 | 7.5 | 7.2 | (5) |
| 107[2] | (50Ti—50Al)N | 9.5 | 12.0 | 1.32 | 0.2 | 10.0 | (6) |
| 115[3] | (50Ti—40Al—10Si)N | 11.8 | 2.6 | 1.05 | 6.8 | 10.2 | (9) |
| 118[3] | TiN—TiCN—$Al_2O_3$—TiN | 12.6 | — | — | Tensile | 6.7 | (9) |

Note:
[1]Example within the present invention.
[2]Comparative Example.
[3]Conventional Example.
(5) Chipping occurred before the expiration of life.
(6) Prematurely worn.
(9) Coating on a cutting edge was damaged and then broken.

Table 5 shows the influence of the nitrogen reaction pressure during coating on the element composition ratio α and residual compression stress of the hard coating. The lower the nitrogen reaction pressure, the higher the residual compression stress and the lower the ratio α in the hard coating. Sample 106 (Comparative Example) coated at the lowest nitrogen reaction pressure of 1.6 Pa in Table 5 had a ratio α of 1.05 and a residual compression stress of 7.5 GPa. This sample had a tool life of 7.2 minutes, shorter than the tool life of 10.2 minutes of Sample 115 (Conventional Example). This appears to be due to the fact that the hard coating of Sample 106 (Comparative Example) had a high residual compression stress. Because the hard coating of Sample 106 (Comparative Example) had a residual compression stress exceeding 6.0 GPa, coating breakage was confirmed in the observation of damage of a cutting edge of an insert in the course of cutting. Using new corners of the insert Sample 106 (Comparative Example), cutting was conducted several times to evaluate reproducibility. As a result, the tool life was unstable in a range of 4.5-8.1 minutes.

Any of Samples 1 and 39-43 (Examples within the present invention) coated at 3.5-11 Pa had a tool life of 20 minutes or more, much longer than that of the CVD-hard-coated tool of Sample 118 (Conventional Example). The cutting test of Samples 1 and 39-43 (Examples within the present invention) revealed that Sample 42 (Example within the present invention) having a of 1.17 was the best without chipping, etc. in the hard coating. However, a hard coating having as relatively low residual compression stress as 0.2 GPa like Sample 107 (Comparative Example) had a tool life of 10 minutes, substantially not different from Sample 115 (Conventional Example). The observation of the damage of a cutting edge in Sample 107 (Comparative Example) after 5 minutes from the cutting start revealed the peeling of a hard coating from a cutting edge substrate and large flank wear and crater wear. The hard coating of Sample 107 (Comparative Example) presumably has low hardness and thus low wear resistance because of low residual compression stress and wear on a cutting edge. In addition, because coating was conducted at as high reaction pressure as 12 Pa, the ratio α exceeded 1.25, the dynamic energy of ions impinging on the substrate was extremely low, and the resultant hard coating had a columnar structure, but the hard coating had many defects with reduced adhesion and wear resistance. Accordingly, to control the ratio α in the hard coating to $0.85 \leq \alpha \leq 1.25$, it has been found that the reaction pressure should be 3.5-11 Pa.

TABLE 6

| Sample No. | Hard Coating Composition (atomic %) | Coating Thickness (μm) | Bias Voltage (V) | Pulse Frequency (kHz) | Positive Bias Voltage (V) |
|---|---|---|---|---|---|
| 1[1] | (50Ti—50Al)N | 11.0 | −50 | 10 | No |
| 44[1] | (50Ti—50Al)N | 11.6 | −100 | 10 | No |
| 45[1] | (50Ti—50Al)N | 10.5 | −80 | 10 | No |
| 46[1] | (50Ti—50Al)N | 9.8 | −60 | 10 | No |
| 47[1] | (50Cr—50Al)N | 10.1 | −20 | 10 | No |
| 48[1] | (50Ti—50Al)N | 11.0 | −50 | 5 | No |
| 49[1] | (50Ti—50Al)N | 11.0 | −50 | 15 | No |
| 50[1] | (50Ti—50Al)N | 11.3 | −50 | 20 | No |
| 51[1] | (50Ti—50Al)N | 10.7 | −50 | 25 | No |
| 52[1] | (50Ti—50Al)N | 10.9 | −50 | 30 | No |
| 53[1] | (37Cr—63Al)N | 11.0 | −50 | 35 | No |
| 54[1] | (35Ti—50Al—15W)N | 11.2 | −50 | 10 | No |
| 55[1] | (30Cr—50Al—10W—10Si)N | 11.1 | −50 | 10 | No |
| 104[2] | (50Ti—50Al)N | 10.2 | −120 | 10 | No |
| 105[2] | (50Ti—50Al)N | 11.3 | −200 | 10 | No |
| 108[2] | (50Ti—50Al)N | 11.2 | −50 | 40 | No |
| 109[2] | (50Ti—50Al)N | 11.5 | −50 | 2 | No |
| 113[3] | TiN + (50Ti—50Al)N + TiN | 4.5 | −50 | No | No |
| 114[3] | (50Ti—50Al)N | 7.0 | −50 | No | No |
| 115[3] | (50Ti—40Al—10Si)N | 11.8 | −50 | No | No |
| 116[3] | (13Ti—17Cr—66Al—4Si)N | 3.0 | −100 | No | No |
| 117[3] | (13Ti—17Cr—66Al—4Si)N | 10.0 | −100 | No | No |

| Sample No. | Residual Compression Stress (GPa) | Peak Intensity Ratios $I_s/I_r$ | $I_l/I_r$ | Half-Value of (200) Plane (°) | Tool Life (min) | Note |
|---|---|---|---|---|---|---|
| 1[1] | 2.4 | 4.6 | 0.7 | 0.6 | 24.4 | — |
| 44[1] | 5.6 | 2.5 | 0.2 | 0.7 | 20.6 | — |
| 45[1] | 5.0 | 3.6 | 0.5 | 0.7 | 21.2 | — |
| 46[1] | 3.5 | 2.9 | 0.7 | 0.6 | 22.5 | — |
| 47[1] | 1.6 | 6.9 | 1.0 | 0.5 | 24.4 | — |
| 48[1] | 2.5 | 4.3 | 0.95 | 0.4 | 25.2 | — |
| 49[1] | 2.9 | 4 | 0.84 | 0.4 | 26.1 | — |
| 50[1] | 3.1 | 3.3 | 0.8 | 0.6 | 26.5 | — |
| 51[1] | 3.6 | 2.9 | 0.72 | 0.6 | 27.4 | — |
| 52[1] | 3.9 | 2.2 | 0.66 | 0.7 | 28.2 | — |
| 53[1] | 5.9 | 2.4 | 0.29 | 0.7 | 28.5 | — |
| 54[1] | 2.6 | 6.2 | 0.88 | 0.7 | 27.2 | — |
| 55[1] | 3.0 | 3.2 | 0.51 | 0.7 | 28.1 | — |
| 104[2] | 7.2 | 1.2 | 0.1 | 0.9 | 13 | (5) |
| 105[2] | 8.1 | 0.6 | 0.1 | 1 | 6.4 | (7) |
| 108[2] | 6.2 | 4.5 | 0.1 | 0.7 | 12.1 | (6) |
| 109[2] | 0.9 | 6.2 | 1.07 | 0.4 | 9.8 | — |
| 113[3] | 4.3 | Detailed analysis could not be conducted because of multi-layer. | | | 8.1 | (12) |
| 114[3] | 6.2 | 4.4 | 0.1 | 0.6 | 9.6 | (9) |
| 115[3] | 6.8 | 3.6 | 0.1 | 0.9 | 10.2 | (9) |

TABLE 6-continued

| 116[3] | 3.3 | 0.9 | 0.3 | 0.8 | 5.2 | (10) |
| 117[3] | 6.5 | 1.1 | 0.2 | 0.9 | 9.8 | (11) |

Note:
[1]Example within the present invention.
[2]Comparative Example.
[3]Conventional Example.
(5) Chipping occurred before the expiration of life.
(6) Prematurely worn.
(7) Chipping occurred at a cutting edge in 10 minutes.
(9) Coating on a cutting edge was damaged and then broken.
(10) Largely worn from the early stage of cutting.
(11) Chipping occurred at a cutting edge in the course of cutting.
(12) Prematurely worn with large deposition.

Table 6 shows the influence of a pulse frequency on the peak intensity ratios of a (111) plane, a (200) plane and a (220) plane in the X-ray diffraction of the hard coating, with the pulse frequency changing from 10 kHz to 35 kHz. Samples 44-47 (Examples within the Present Invention) were coated at a constant pulse frequency of 10 kHz, with only bias voltage changed. Samples 48-55 (Examples within the Present Invention) were coated at a constant bias voltage of −50 V, with only the pulse frequency changed. Samples 113-117 (Conventional Examples) were coated by PVD using DC bias voltage without pulsation.

As the bias voltage changed in coating, the ratio $I_s/I_r$ of the peak intensity $I_s$ of a (200) plane to the peak intensity $I_r$ of a (111) plane changed in the X-ray diffraction of the hard coating, resulting in changing the residual compression stress of the hard coating. The larger the residual stress, the shorter the tool life. The change of only the pulse frequency also led to the change of the residual compression stress of the hard coating, confirming that the pulse frequency largely affects the tool life. The hard coating of Sample 116 (Conventional Example) formed at DC bias voltage of −100 V was as thin as 3 μm, suffering from large wear from the early stage of cutting. Sample 117 (Conventional Example) coated under the same conditions as in Sample 116 (Conventional Example) except for changing the thickness by controlling the coating time had higher residual stress than those of Samples 44-55 (Examples within the present invention), resulting in peeling and chipping from the early stage of cutting and thus a poor tool life.

Samples 44-55 (Examples within the Present Invention) had peak intensity ratios $I_t/I_r$ of 0.2-1.0, wherein $I_t$ and $I_r$ represent peak intensities of a (220) plane and a (111) plane, respectively, in the X-ray diffraction of the hard coating. The higher the orientation to a (111) plane, the higher the residual compression stress. For instance, the hard coating of Sample 115 (Conventional Example) thicker than 10 μm had as low a peak intensity ratio $I_t/I_r$ as 0.1, a residual compression stress of 6.8 GPa, and a tool life of 10.2 minutes. Samples 44-55 (Examples within the Present Invention) coated with pulsed bias voltage had peak intensity ratios $I_t/I_r$ in a range of 0.2-1.0. These samples had residual compression stress of 2.5-5.9 GPa. It is clear from Table 6 that the change of the pulse frequency leads to the change of the peak intensity ratio $I_t/I_r$. There is a correlation between the pulse frequency and the residual compression stress of the resultant hard coating: The higher the pulse frequency, the larger the residual compression stress. This appears to be due to the fact that a higher pulse frequency is closer to DC bias voltage. In Sample 53 (Example within the present invention) having the best tool life, the pulse frequency was 35 kHz, and the residual compression stress was 5.9 GPa. The observation of damage in a cutting edge in the course of cutting revealed that there were no peeling and chipping in the hard coating near the cutting edge, showing normal wear. Examples within the present invention coated with pulsed bias voltage had tool lives longer than 2 times those of Conventional Examples.

It was found that the half-value W of a (200) plane in the X-ray diffraction of the hard coating influenced a tool life. Namely, when the half-value W of a (200) plane was larger than 0.7°, the tool life was short. When the half-value of a (200) plane exceeded 0.7°, the residual compression stress of the hard coating tended to increase, largely influencing the adhesion of the hard coating, resulting in deteriorating the tool life.

TABLE 7

| Sample No. | Hard Coating Composition (atomic %) | Coating Thickness (μm) | Ra | $I_t/I_r$ | Residual Compression Stress (GPa) | Tool Life (min) |
| --- | --- | --- | --- | --- | --- | --- |
| 1[1] | (50Ti—50Al)N | 11.0 | 0.1 | 0.7 | 2.4 | 24.4 |
| 56[1] | (50Ti—50Al)N | 11.2 | 0.2 | 0.75 | 2.7 | 26.7 |
| 57[1] | (50Ti—50Al)N | 10.8 | 0.5 | 0.8 | 3.2 | 27.7 |
| 58[1] | (50Ti—50Al)N | 10.7 | 0.7 | 0.89 | 3.6 | 27.7 |

Note:
[1]Example within the present invention.

Table 7 shows the influence of the surface roughness Ra of the substrate on the ratio $I_t/I_r$ of a peak intensity $I_t$ of a (220) plane to a peak intensity $I_r$ of a (111) plane in the X-ray diffraction of the hard coating. Using cemented carbide substrates having as-sintered surfaces and ground surfaces with various grinding degrees, the surface roughness Ra was changed. Turning inserts used in this evaluation had as-sintered flank surfaces. It was found that the surface roughness Ra of the substrate influenced the peak intensity ratio $I_t/I_r$ of the hard coating; the larger the surface roughness Ra of the substrate, the larger the peak intensity ratio $I_t/I_r$. Sample 58 (Example within the present invention) whose substrate had a large surface roughness Ra had a tool life of 27.7 minutes, longer than that of Sample 1 (Example within the present invention) by more than 10%.

TABLE 8

| Sample No. | Hard Coating Composition (atomic %) | Coating Thickness T (μm) | Coating Temp. (° C.) | L/T |
| --- | --- | --- | --- | --- |
| 1[1] | (50Ti—50Al)N | 11.0 | 600 | 0.56 |
| 59[1] | (50Ti—50Al)N | 11.5 | 550 | 0.22 |
| 60[1] | (50Ti—50Al)N | 11.3 | 570 | 0.4 |
| 61[1] | (50Ti—50Al)N | 11.2 | 590 | 0.44 |
| 62[1] | (50Ti—50Al)N | 11.7 | 650 | 0.98 |
| 63[1] | (50Ti—50Al)N | 11.6 | 740 | 1.25 |
| 110[2] | (50Ti—50Al)N | 11.1 | 450 | 0.04 |

TABLE 8-continued

| | | | | |
|---|---|---|---|---|
| 111[2] | (50Ti—50Al)N | 11.4 | 500 | 0.07 |
| 112[2] | (50Ti—50Al)N | 11.5 | 760 | 1.26 |
| 113[3] | TiN + (50Ti—50Al)N + TiN | 4.5 | 450 | 0.04 |
| 114[3] | (50Ti—50Al)N | 7.0 | 500 | 0.05 |
| 115[3] | (50Ti—40Al—10Si)N | 11.8 | 500 | 0.07 |
| 116[3] | (13Ti—17Cr—66Al—4Si)N | 3.0 | 577 | — |
| 117[3] | (13Ti—17Cr—66Al—4Si)N | 10.0 | 577 | — |
| 118[3] | TiN—TiCN—$Al_2O_3$—TiN | 12.6 | 900-1000 | — |

| Sample No. | Residual Compression Stress (GPa) | Tool Life (min) | Note |
|---|---|---|---|
| 1[1] | 2.4 | 24.4 | — |
| 59[1] | 5.8 | 20.4 | — |
| 60[1] | 3.1 | 22.1 | — |
| 61[1] | 2.1 | 25.6 | — |
| 62[1] | 1.9 | 26.2 | — |
| 63[1] | 1.6 | 18.4 | — |
| 110[2] | 6.4 | 10.6 | (8) |
| 111[2] | 5.8 | 10.4 | — |
| 112[2] | 1.6 | 9.2 | — |
| 113[3] | 4.3 | 8.1 | (12) |
| 114[3] | 6.2 | 9.6 | (9) |
| 115[3] | 6.8 | 10.2 | (9) |
| 116[3] | 3.3 | 5.2 | (10) |
| 117[3] | 6.5 | 9.8 | (11) |
| 118[3] | Tensile | 6.7 | (9) |

Note:
[1]Example within the present invention.
[2]Comparative Example.
[3]Conventional Example.
[8]Chipping occurred prematurely.
[9]Coating on a cutting edge was damaged and then broken.
[10]Largely worn from the early stage of cutting.
[11]Chipping occurred at cutting edge in the course of cutting.
[12]Prematurely worn with large deposition.

Figure 7A:
FIG. 7(a) is a photomicrograph showing a cross section having gaps around droplets in the hard coating.
Figure 7B:
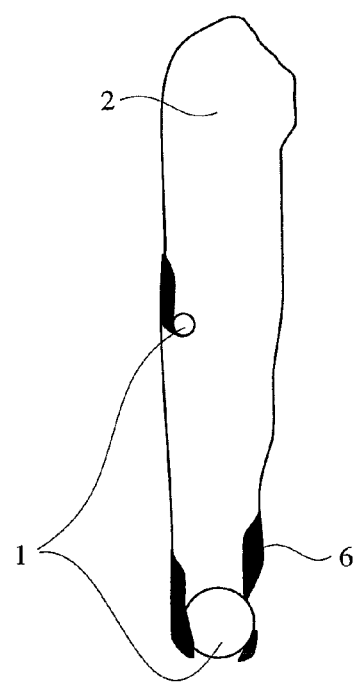
FIG. 7(b) is a schematic view of the photomicrograph of FIG. 7(a).

The influence of a coating temperature on the growth of crystal grains on droplets was investigated. The results are shown in Table 8. The comparison of residual compression stress between Sample 59 (Example within the present invention) and Sample 63 (Example within the present invention), for instance, indicates that Sample 63 (Example within the present invention) produced at a higher coating temperature had a lower residual compression stress. Sample 111 (Comparative Example) coated at 500° C. had an L/T ratio of 0.07, a residual compression stress of 5.8 GPa, and a tool life of 10.4 minutes, on the same level as the tool life of Sample 114 (Conventional Example) produced at the same coating temperature. Sample 110 (Comparative Example) coated at 450° C., lower than 500° C., had an L/T ratio of 0.04, having an tendency of having smaller L/T as the coating temperature lowered. Sample 110 (Comparative Example) had a residual compression stress of 6.4 GPa and a tool life of 8.6 minutes. The observation of the damage of cutting edges in cutting using Samples 110 and 111 (Comparative Examples) revealed that large numbers of micro-chipping appeared due to coating breakage in the edges of both Samples after cutting for 5 minutes, followed by large damage. The tool lives of Samples 110 and 111 (Comparative Examples) were longer than that of the CVD-coated insert of Sample 118 (Conventional Example), but substantially the same as those of the PVD-coated inserts of Samples 113-117 (Conventional Examples). The cross section observation of the hard coating of both Samples after cutting revealed that droplets were contained in the hard coating. Further detailed observation indicated that substantially no TiAlN crystals grew on droplet surfaces, with many TiAl metal grains. Observation around the TiAl metal grains revealed that there were many gaps 6 in boundaries between the droplets 1 and the surrounding TiAlN regions as shown in FIGS. 7(a) and 7(b). It is considered that the hard coating could not withstand impact during cutting because of the existence of gaps, resulting in chipping.

Figure 8A:
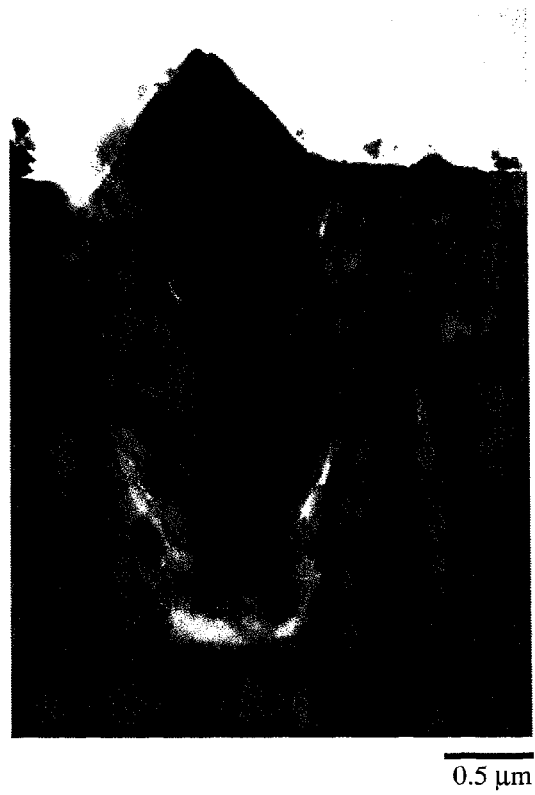
FIG. 8(a) is a photomicrograph showing a cross section of a TiAlN crystal grown from a droplet in the hard coating of Samples 62 (Example within the present invention).
Figure 8B:
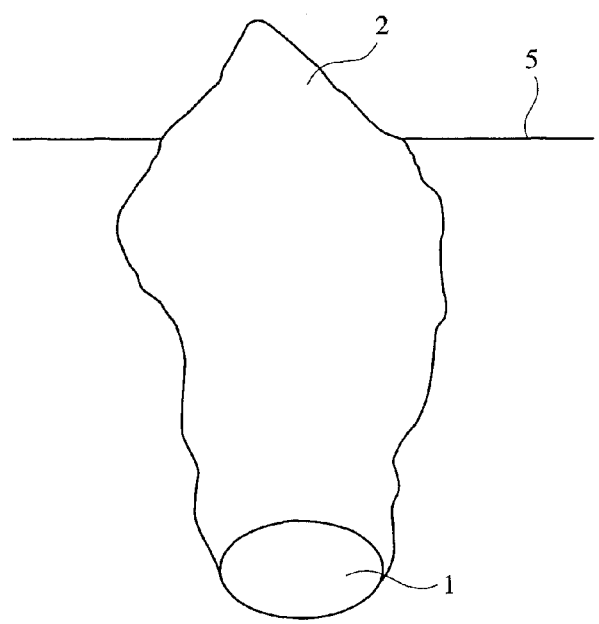
FIG. 8(b) is a schematic view of the photomicrograph of FIG. 8(a).

Sample 61 (Example within the present invention) produced at a coating temperature controlled at 590° C. had an L/T ratio of 0.44 and a residual compression stress of 2.1 GPa. Sample 63 (Example within the present invention) coated at 740° C. had an L/T ratio of 1.25 and a residual compression stress of 1.6 GPa. There were no unstable factors such as chipping and the peeling of a coating at all in these Samples from the early stage of cutting, so that the test was stopped by sparking when flank wear reached 0.4 mm, which was regarded as a tool life. These Samples' tool lives were 25.6 minutes and 26.2 minutes, respectively, on an excellent level. Cross section observation revealed that the hard coating of Sample 62 (Example within the present invention) having the best tool life contained droplets like other Samples. Observation by TEM revealed that TiAlN crystal grains 2 grew from the droplets 1 as shown in FIGS. 8(a) and 8(b). The crystal grains 2 projected from the hard coating surface 5. It was also confirmed that there were few gaps around the crystal grains 2, surrounded by a TiAlN crystal structure. Accordingly, the hard coating had improved mechanical strength despite droplets contained therein, resulting in much better cutting performance than that of Samples 113-117 (Conventional Examples).

Figure 9:
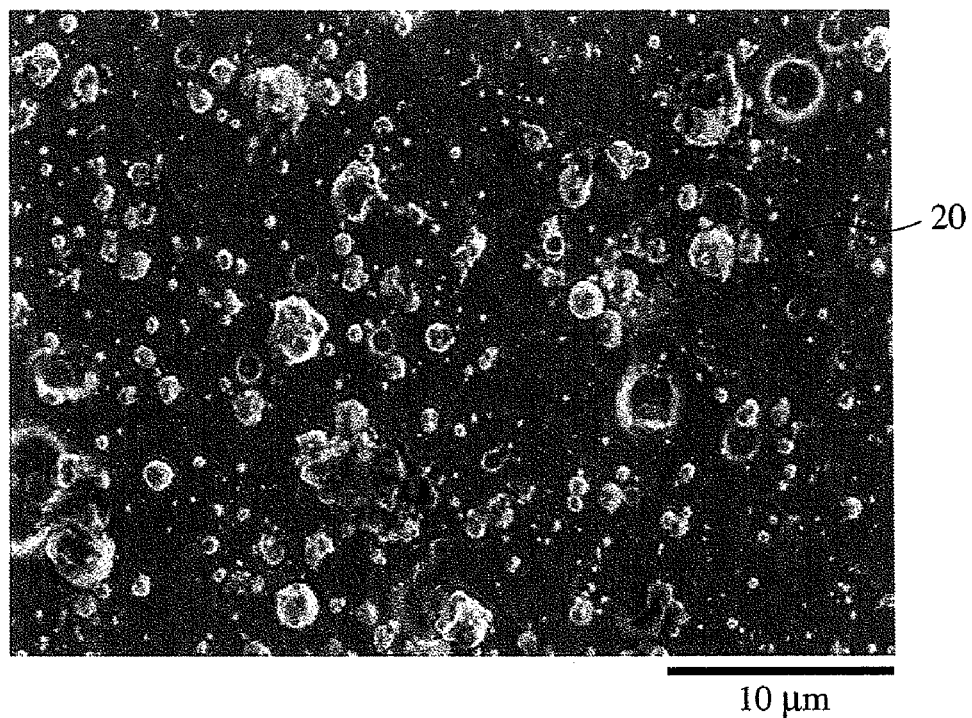
FIG. 9 is a photomicrograph showing large numbers of projections existing on a hard coating surface of Sample 112 (Comparative Example).

Sample 112 (Comparative Example) coated at 760° C. had L/T of 1.26 and a residual compression stress of 1.6 GPa. The coated Sample had rough texture before used for cutting, and its surface observation revealed that there were large numbers of projections 20 on the coating surface as shown in FIG. 9. A cutting test was conducted to examine the damage of a cutting edge, confirming small breakage in the coating at the cutting edge, though there was no large peeling of the coating at the insert edge. Also, the work was deposited on the projections 20 on the surface. Detailed observation by a scanning electron microscope revealed that the coating was locally detached from the substrate in a damaged portion of the coating. Observation in the deposited portion revealed that particles grown from inside the hard coating acted like a file on which the work was deposited. The observation of the cross section of a hard coating near a cutting edge in Sample 112 (Comparative Example) revealed that extremely large TiAlN crystal grains grown from droplets radially projected from the hard coating surface. It is considered that because of large numbers of gaps existing around the projections, they could not withstand cutting impact so that they were detached. It was found that when compound crystal grains grown from droplets included in the hard coating acted as starting points of defects, excellent cutting performance could not be obtained despite a low residual compression stress. Also, because the crystals grew discontinuously, the hard coating had a fine structure. Although Sample 112 (Comparative Example) underwent normal wear except for local damage, its flank wear width was 0.114 mm, larger than 0.102 mm in the CVD-coated tool of Sample 118 (Conventional Example). This appears to be due to large influence of the internal defects.

TABLE 9

| Sample No. | Hard Coating Composition (atomic %) | Coating Thickness (μm) | Bias Voltage (V) | Pulse Frequency (kHz) |
|---|---|---|---|---|
| 1[1] | (50Ti—50Al)N | 11.0 | −50 | 10 |
| 64[1] | (50Ti—50Al)N | 11.4 | −60 | 10 |
| 65[1] | (50Ti—50Al)N | 11.0 | −80 | 20 |
| 66[1] | (50Ti—50Al)N | 11.0 | −100 | 35 |
| 67[1] | (40Ti—50Al—10W)N | 11.0 | −100 | 10 |

TABLE 9-continued

| | | | | |
|---|---|---|---|---|
| 68[1] | (50Cr—40Al—10Si)N | 11.0 | −100 | 10 |
| 69[1] | (45Ti—50Al—5Si)N | 11.1 | −100 | 10 |

| Sample No. | Positive Bias Voltage (V) | Residual Compression Stress (GPa) | Composition Variation | Tool Life (min) |
|---|---|---|---|---|
| 1[1] | No | 2.4 | No | 24.4 |
| 64[1] | No | 1.0 | Yes | 25.0 |
| 65[1] | No | 1.6 | Yes | 26.9 |
| 66[1] | No | 2.1 | Yes | 27.7 |
| 67[1] | No | 2.1 | Yes | 29.0 |
| 68[1] | No | 2.2 | Yes | 27.4 |
| 69[1] | No | 6.0 | Yes | 28.0 |

Note:
[1]Example within the present invention.

Coating was conducted with a pulsed bias voltage of −60 to −100 V at a pulse frequency of 10-35 kHz. The results are shown in Table 9. The hard coatings of Samples 64-68 (Examples within the Present Invention) coated with a pulsed bias voltage tended to have smaller residual compression stress as the bias voltage lowered. Samples 64-68 (Examples within the Present Invention) had longer tool lives than that of Sample 1 (Example within the present invention) produced at a pulsed bias voltage of −50 V. It is considered that the application of a pulsed bias voltage in a range of −60 to −100 V provided the coating with a composition variation and thus decrease in residual compression stress, resulting in excellent wear resistance and chipping resistance.

Figure 10A:
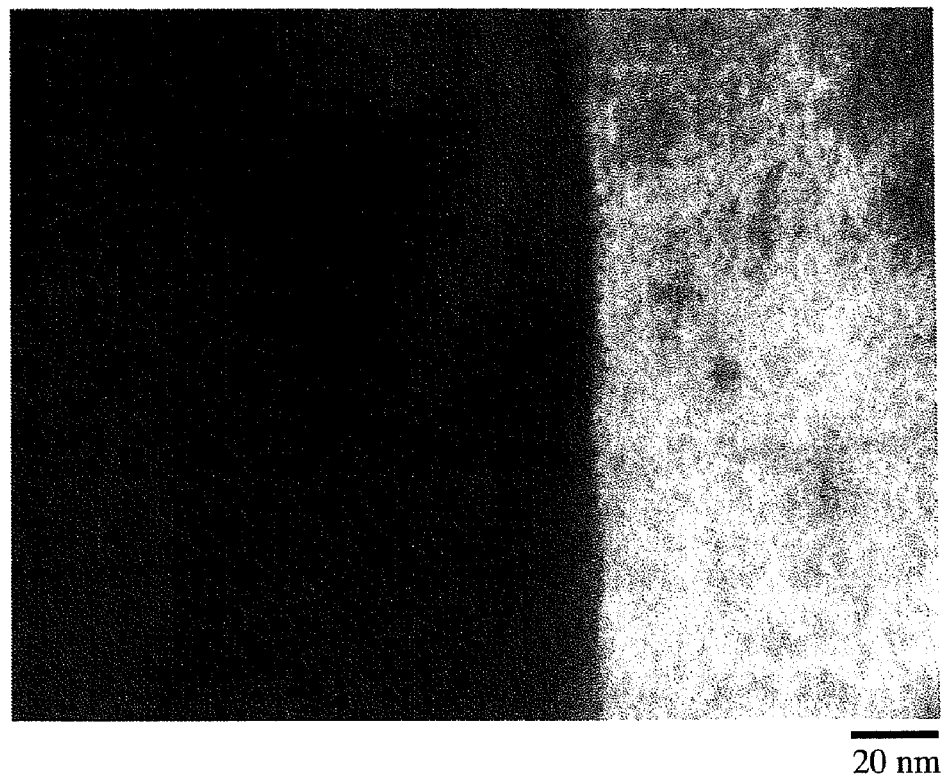
FIG. 10(a) is a photomicrograph showing a cross section of the hard coating of Samples 67 (Example within the present invention), which has multi-layer crystal grains.
Figure 10B:
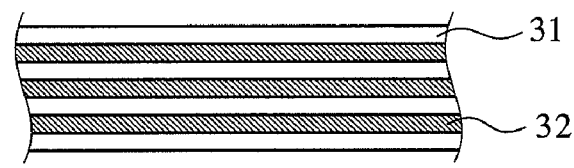
FIG. 10(b) is a schematic view of the photomicrograph of FIG. 10(a).

The observation of a hard coating in the course of cutting revealed that the inserts of Samples 64-69 (Examples within the Present Invention) underwent no breakage in hard coatings at cutting edges with normal wear until the expiration of life. It was observed that the hard coating of Sample 67 (Example within the present invention) with the best tool life had a cross section having a columnar crystal structure. Detailed observation revealed that crystal grains had a multi-layer structure comprising alternately laminated Al-poor layers 31 and Al-rich layers 32 with a lamination period of about 10 nm as shown in FIGS. 10(a) and 10(b). It was thus confirmed that the content of Al having a small ion radius were changing. The composition of each layer was analyzed by an energy-dispersive X-ray spectroscope (EDS) attached to a field-emission transmission electron microscope called "TEM" (JEM-2010F available from JEOL Ltd.) at an acceleration voltage of 20 kV. It is considered that because crystal grains had such a multi-layer structure, the hard coating had a further reduced residual compression stress. It was also confirmed that lattice fringes were continuous between layers in the multi-layer structure, resulting in excellent wear resistance and chipping resistance. Particularly when the pulse frequency was in a range of 10-35 kHz, coated tools had excellent lives.

TABLE 10

| Sample No. | Hard Coating Composition (atomic %) | Coating Thickness (μm) | Bias Voltage (V) | Pulse Frequency (kHz) | Positive Bias Voltage (V) |
|---|---|---|---|---|---|
| 1[1] | (50Ti—50Al)N | 11.0 | −50 | 10 | No |
| 70[1] | (50Ti—50Al)N | 11.3 | −50 | 10 | 5 |
| 71[1] | (50Ti—50Al)N | 11.2 | −50 | 10 | 10 |
| 72[1] | (50Ti—50Al)N | 11.6 | −50 | 10 | 20 |

| Sample No. | Scratching Test Lc (N) | Residual Compression Stress (GPa) | Tool Life (min) |
|---|---|---|---|
| 1[1] | 12 | 2.4 | 24.4 |
| 70[1] | 20 | 2.0 | 26.1 |
| 71[1] | 21 | 2.0 | 26.4 |
| 72[1] | 20 | 2.0 | 26.6 |

Note:
[1]Example within the present invention.

To examine the influence of a pulsed bias voltage applied during coating on residual compression stress and adhesion in a scratching test, Samples was produced at a fixed bias voltage of −50V and a fixed pulse frequency of 10 kHz, with a positive bias voltage changing from +5 V to +20 V. The results are shown in Table 10. Any of Samples 70-72 (Examples within the present invention) had a residual compression stress of 2.0 GPa, and adhesion of 20 N or more in the scratching test, as high as 1.6 times or more that of Sample 1 (Example within the present invention). This is due to the fact that the intermittently applied positive bias voltage had a large variation, resulting in largely variable ion energy impinged on the substrate. Because soft layers were formed at low ion energy, while hard layers were formed at high ion energy, the multi-layer hard coating had a low residual compression stress. Accordingly, Samples 70-72 (Examples within the Present Invention) had higher adhesion and better tool life than those of Sample 1 (Example within the present invention).

TABLE 11

| Sample No. | Hard Coating Composition (atomic %) | Coating Thickness (μm) | Bias Voltage (V) | Pulse Frequency (kHz) | Positive Bias Voltage (V) |
|---|---|---|---|---|---|
| 1[1] | (50Ti—50Al)N | 11.0 | −50 | 10 | No |
| 73[1] | Two layers having lower (40Ti—60Al)N layer, and upper (80Ti—20Si)N layer | 11.2 | −50 | 10 | No |
| 74[1] | Six layers alternately having lower (40Cr—60Al)N layers, and upper (80Ti—20Si)N layers | 11.4 | −80 | 10 | No |
| 75[1] | Nine layers alternately having lower (40Cr—60Al)N layers, intermediate (80Ti—20Si)N layers, and outermost (75Al—25Si)N layers | 11.5 | −120 | 10 | No |
| 118[3] | TiN—TiCN—Al$_2$O$_3$—TiN | 12.6 | CVD | — | — |

TABLE 11-continued

| Sample No. | Residual Compression Stress (GPa) | Tool Life (min) | Note |
|---|---|---|---|
| 1[1] | 2.4 | 24.4 | — |
| 73[1] | 3.6 | 27.0 | — |
| 74[1] | 3.4 | 27.4 | — |
| 75[1] | 5.8 | 27.2 | — |
| 118[3] | Tensile | 6.7 | (9) |

Note:
[1]Example within the present invention.
[3]Conventional Example.
(9) Coating on a cutting edge was damaged and then broken.

The influence of a multi-layer hard coating structure comprising different-composition layers on residual compression stress and tool life was investigated. The results are shown in Table 11. Samples 73-75 (Examples within the present invention) had tool lives of 27.0 minutes, 27.4 minutes and 27.2 minutes, respectively, better than those of the CVD-coated tools of Sample 1 (Example within the present invention) and Sample 118 (Conventional Example). In conventional technologies, multi-layer hard coatings tend to have strain between layers, resulting in increased residual compression stress. However, the hard-coated members of the present invention had hard coatings having few defects and smaller residual compression stress than 6.0 GPa, even when coating was conducted at a bias voltage of −80 to −120 V, higher than −50 V in Sample 1 (Example within the present invention). The observation of these Samples in the course of cutting revealed that there was no damage such as peeling, chipping, etc. in their hard coatings at cutting edges. The method described herein has made it possible to measure residual compression stress not only in hard coatings having complicated compositions but also in multi-layer hard coatings such as Samples 73-75 (Examples within the Present Invention), so that designing of the hard coatings having high adhesion, wear resistance and chipping resistance has become easy.

TABLE 12

| Sample No. | Hard Coating Composition (atomic %) | Coating Thickness (μm) | Blasting Time (sec) | TA/TB β |
|---|---|---|---|---|
| 1[1] | (50Ti—50Al)N | 11.0 | 0 | — |
| 76[1] | (50Ti—50Al)N | 12.2 | 30 | 305 |
| 77[1] | (50Ti—50Al)N | 11.7 | 15 | 220 |
| 78[1] | (50Ti—50Al)N | 11.4 | 10 | 105 |
| 79[1] | (50Ti—50Al)N | 12.2 | 5 | 1.2 |
| 118[3] | TiN—TiCN—Al₂O₃—TiN | 12.6 | No | No |
| 119[3] | TiN—TiCN—Al₂O₃—TiN Surface-worked after coating | 12.6 | 10 | 270 |

| Sample No. | Residual Compression Stress (GPa) | Tool Life (min) | Note |
|---|---|---|---|
| 1[1] | 2.4 | 24.4 | — |
| 76[1] | 2.5 | 24.4 | — |
| 77[1] | 2.4 | 27.1 | — |
| 78[1] | 2.7 | 26.9 | — |
| 79[1] | 2.6 | 26.7 | — |
| 118[3] | Tensile | 6.7 | (9) |
| 119[3] | Tensile | 7 | (9) |

Note:
[1]Example within the present invention.
[3]Conventional Example.
(9)Coating on a cutting edge was damaged and then broken.

The influence of the machining of the hard coating surface on cutting performance was investigated. The results are shown in Table 12. Samples 76-79 (Examples within the Present Invention) whose hard coatings were wet-blasted had tool lives equal to or more than that of Sample 1 (Example within the present invention). The hard coating thickness of Sample 76 (Example within the present invention) wet-blasted for 30 seconds was 12.2 μm in the thickest portion near a cutting edge and 0.04 μm in the thinnest portion. As a result, β=305. Although no large coating breakage in an early stage of cutting and sudden failure were observed, the substrate was slightly prematurely exposed at a cutting edge, resulting in a tool life on the same level as that of Sample 1 (Example within the present invention). A failure mechanism in this cutting test hard started from chipping or breakage of less than 1 μm in the coating. With a large residual compression stress, failure exceeding 10 μm occurs, but that failure is extremely small in the hard-coated member of the present invention. It has been found that with a hard coating surface made smooth by machining, damage less than 1 μm generated by impact at an early stage of cutting can be suppressed. Sample 119 (Conventional Example) obtained by wet-blasting the CVD-coated tool of Sample 118 (Conventional Example) for 10 seconds had a longer tool life than the untreated Sample 118 (Conventional Example) by 0.3 minutes, though it had poorer chipping resistance than that of hard-coated member of the present invention having a proper residual compression stress.

TABLE 13

| Sample No. | Hard Coating Composition (atomic %) | Coating Thickness (μm) | Face Angle θ₁ (°) |
|---|---|---|---|
| 1[1] | (50Ti—50Al)N | 11.0 | 5 |
| 80[1] | (50Ti—50Al)N | 10.6 | 10 |
| 81[1] | (50Ti—50Al)N | 11.1 | 15 |
| 82[1] | (50Ti—50Al)N | 11.3 | 35 |
| 83[1] | (50Ti—50Al)N | 11.2 | 40 |

| Sample No. | Residual Compression Stress (GPa) | Tool Life (min) | Note |
|---|---|---|---|
| 1[1] | 2.4 | 24.4 | — |
| 80[1] | 2.4 | 24.2 | (13) |
| 81[1] | 2.5 | 26.4 | (14) |
| 82[1] | 2.3 | 26.6 | (14) |
| 83[1] | 2.4 | 5.5 | (15) |

Note:
[1]Example within the present invention.
(13)The same as Sample 1.
(14)Low cutting resistance.
(15)Failure occurred at a tip end portion at an early stage of cutting.

Samples with varied rake angles of turning inserts were produced to investigate the influence of a rake angle on cutting performance. The results are shown in Table 13. It is clear from Table 13 that a larger rake angle provides a longer tool life. This appears to be due to the fact that because a hard coating having compression stress is coated in a thickness of 10 μm or more, a cutting edge is provided with improved impact resistance and chipping resistance, and a thicker coating provides improved wear resistance, resulting in exhibiting effects with a shape having sharpness inherent in the tool. However, with a shape having a rake angle exceeding 40°, high chipping resistance cannot be obtained, resulting in failure at an early stage of cutting.

TABLE 14

| Sample No. | Hard Coating Composition (atomic %) | Coating Thickness (μm) | Hexagonal Crystal | Residual Compression Stress (GPa) | Tool Life (min) |
|---|---|---|---|---|---|
| 1[(1)] | (50Ti—50Al)N | 11.0 | No | 2.4 | 24.4 |
| 84[(1)] | (50Ti—50Al)N + TiB$_2$ | 11.2 | Outermost layer of hexagonal crystal structure | 2.5 | 26.1 |
| 85[(1)] | (50Ti—50Al)N + WC | 11.1 | Outermost layer of hexagonal crystal structure | 1.3 | 26.1 |

Note:
[(1)]Example within the present invention.

Research was conducted to improve the lubrication of the hard coating. The lubrication of the hard coating depends not only on constituent elements but also on a crystal structure. Materials having a graphite structure or a hexagonal crystal structure have higher lubrication than that of materials having a face-centered cubic structure. Sample 84 (Example within the present invention) had a hexagonal crystal of TiB$_2$ coated as an outermost layer immediately on the hard coating having a face-centered cubic structure, and Sample 85 (Example within the present invention) similarly had an outermost layer of WC. The tool lives of these Samples are shown in Table 14. Samples 84 and 85 (Examples within the Present Invention) each having a hard coating having a hexagonal crystal structure as an outermost layer had better tool lives than that of Sample 1 (Example within the present invention) having only a face-centered cubic. The observation of the damage of a cutting edge in the course of cutting revealed that crater wear occurred in a tool rake face of Sample 1 (Example within the present invention) but not in Samples 84 and 85 (Examples within the Present Invention), when 10 minutes passed from the start of cutting. A crater wear mechanism appears to have a relation with the lubrication of the hard coating. Because the cutting temperature is low in the hard coating having excellent lubrication, the oxidation of the hard coating, the diffusion of a work into the hard coating, etc. are suppressed, resulting in decreased crater wear. The same effects are expected not only in TiB$_2$ and WC formed as an outermost layer in Examples within the present invention, but also in MoS$_2$, WS$_2$, CrB$_2$, etc.

TABLE 15

| Sample No. | Hard Coating Composition (atomic %) | Coating Thickness (μm) | Metal Layer (nm) | Residual Compression Stress (GPa) | Tool Life (min) |
|---|---|---|---|---|---|
| 1[(1)] | (50Ti—50Al)N | 11.0 | No | 2.4 | 24.4 |
| 86[(1)] | (50Ti—50Al)N | 10.8 | 10 | 1.9 | 27.7 |
| 87[(1)] | (50Ti—50Al)N | 11.1 | 200 | 1.5 | 27.9 |
| 88[(1)] | (50Ti—50Al)N | 11.2 | 210 | 1.2 | 24.1 |

Note:
[(1)]Example within the present invention.

To increase adhesion, a metal layer having a thickness of 10-210 nm was formed between the substrate and the hard coating. The results are shown in Table 15. The metal layer was coated using Ti, Cr and a TiAl alloy at a DC bias voltage of −700 V for 5 minutes. Sample 88 (Example within the present invention) having a 210-nm-thick metal layer had the same tool life as that of Sample 1 (Example within the present invention). However, Samples 86 and 87 (Examples within the Present Invention) having metal layers of 10 nm and 200 nm, respectively, had better tool lives by 10% or more than that of Sample 1 (Example within the present invention). With a metal layer formed as a first layer, the residual compression stress of the entire hard coating was alleviated, resulting in increased adhesion. When the metal layer is thicker than 200 nm as in Sample 88 (Example within the present invention), large numbers of droplets are deposited on the metal layer surface, resulting in poor adhesion to a hard coating formed immediately thereon, and thus failing to improve a tool life.

Layers of crystalline or amorphous oxides of Al, Zr, Y, etc. or their mixtures have relatively large residual compression stress. Accordingly, when they are used, coating conditions are preferably controlled such that the residual stress of the overall hard coating by a curvature measurement method is 5.0 GPa or less. When the residual stress of the hard coating is close to 6.0 GPa, a hard coating layer of TiN, CrN, ZrN, etc. may be further provided. The residual stress distribution of the hard coating may be changed by ion implantation, etc. The ion-implanted substrate has high adhesion to a hard coating to be formed.

What is claimed is:

1. A hard-coated member having a hard coating having a compression stress and a thickness of 5 μm or more, said hard coating being made of a compound having a composition represented by $(Me_{1-a}X_a)_\alpha(N_{1-x-y}C_xO_y)$, wherein Me is at least one element selected from Groups 4a, 5a and 6a, X is at least one element selected from the group consisting of Al, Si, B and S, a, x and y are respectively the contents (atomic ratios) of X, C and O, and α is a ratio of $(Me_{1-a}X_a)$ to $(N_{1-x-y}C_xO_y)$, meeting $0.1 \leq a \leq 0.65$, $0 \leq x \leq 0.1$, $0 \leq y \leq 0.1$, and $0.85 \leq \alpha \leq 1.25$; compound crystal grains grown from $(Me_{1-a}X_a)$-based droplets in the hard coating projecting from the hard coating surface; and a ratio L/T of the length L of said compound crystal grains to the thickness T of the coating meeting $0.1 \leq L/T \leq 1.2$.

2. The hard-coated member according to claim 1, wherein said hard coating has a face-centered cubic structure and the X-ray diffraction of said hard coating has a peak intensity $I_r$ of a (111) plane, a peak intensity $I_s$ of a (200) plane, and a peak intensity $I_t$ of a (220) plane, meeting $2 \leq I_s/I_r$, and $0.2 \leq I_t/I_r \leq 1$, and said (200) plane having a half-value W(°)≦0.7.

3. The hard-coated member according to claim 1, wherein said hard coating is constituted by layers having a columnar crystal structure having a composition variation.

4. The hard-coated member according to claim 1, wherein said hard coating has adhesion of 10 N (newton) or more to a substrate.

5. The hard-coated member according to claim 1, wherein the hard coating has a thickest portion and a thinnest portion, a thickness ratio β (TA/TB) meeting $1 \leq \beta \leq 300$, wherein TA represents the thickness of the thickest portion, and TB represents the thickness of the thinnest portion.

6. The hard-coated member according to claim 1, which comprises an outermost layer having a hexagonal crystal structure.

7. The hard-coated member according to claim 1, which comprises a metal layer having a thickness of 10-200 nm between said substrate and said hard coating.

8. A method for producing the hard-coated member recited in claim 1, wherein coating is conducted at a substrate temperature of 550-800° C. and a reaction pressure of 3.5-11 Pa.

9. The method for producing a hard-coated member according to claim 8, wherein coating is conducted at a bias voltage of −20 to −100 V and a pulse frequency of 5-35 kHz.

10. The hard-coated member according to claim 2, wherein said hard coating is constituted by layers having a columnar crystal structure having a composition variation.

11. The hard-coated member according to claim 2, wherein said hard coating has adhesion of 10 N (newton) or more to a substrate.

12. The hard-coated member according to claim 2, wherein the hard coating has a thickest portion and a thinnest portion, a thickness ratio β (TA/TB) meeting $1 \leq \beta \leq 300$, wherein TA represents the thickness of the thickest portion, and TB represents the thickness of the thinnest portion.

13. The hard-coated member according to claim 2, which comprises an outermost layer having a hexagonal crystal structure.

14. The hard-coated member according to claim 2, which comprises a metal layer having a thickness of 10-200 nm between said substrate and said hard coating.

15. A method for producing the hard-coated member recited in claim 2, wherein coating is conducted at a substrate temperature of 550-800° C. and a reaction pressure of 3.5-11 Pa.

16. The method for producing a hard-coated member according to claim 15, wherein coating is conducted at a bias voltage of −20 to −100 V and a pulse frequency of 5-35 kHz.

* * * * *